United States Patent [19]

Horne

[11] Patent Number: 5,444,406

[45] Date of Patent: Aug. 22, 1995

[54] SELF-ADJUSTING VARIABLE DRIVE STRENGTH BUFFER CIRCUIT AND METHOD FOR CONTROLLING THE DRIVE STRENGTH OF A BUFFER CIRCUIT

[75] Inventor: Stephen C. Horne, Austin, Tex.

[73] Assignee: Advanced Micro Devices, Inc., Sunnyvale, Calif.

[21] Appl. No.: 14,955

[22] Filed: Feb. 8, 1993

[51] Int. Cl.⁶ .............................. H03K 5/13
[52] U.S. Cl. .................... 327/277; 327/284; 326/26; 326/83
[58] Field of Search ............... 307/443, 269, 270, 603, 307/606; 328/55

[56] References Cited

U.S. PATENT DOCUMENTS

| | | | |
|---|---|---|---|
| 4,291,242 | 9/1981 | Schriber | 307/270 |
| 4,810,908 | 3/1989 | Suzuki et al. | 307/480 |
| 4,816,700 | 3/1989 | Imel | 307/269 |
| 4,851,717 | 7/1989 | Yabe | 307/465 |
| 4,866,310 | 9/1989 | Ando et al. | 307/480 |
| 4,922,136 | 5/1990 | Ueda | 307/465.1 |
| 4,922,141 | 5/1990 | Lofgren et al. | 307/603 |
| 4,929,854 | 5/1990 | Iino et al. | 307/480 |
| 4,965,471 | 10/1990 | Gaboury | 307/446 |
| 4,970,405 | 11/1990 | Hagiwara | 307/269 |
| 5,001,731 | 3/1991 | Atwell, Jr. et al. | 375/107 |
| 5,013,942 | 5/1991 | Nishimura et al. | 307/480 |
| 5,029,279 | 7/1991 | Sasaki et al. | 307/303.1 |
| 5,045,725 | 9/1991 | Sasaki et al. | 307/465 |
| 5,058,132 | 10/1991 | Li | 375/38 |
| 5,073,730 | 12/1991 | Hoffman | 307/480 |
| 5,077,676 | 12/1991 | Johnson et al. | 364/489 |
| 5,079,440 | 1/1992 | Roberts et al. | 307/269 |
| 5,087,842 | 2/1992 | Pulsipher | 307/606 |
| 5,111,086 | 5/1992 | Back | 307/603 |
| 5,237,224 | 8/1993 | DeLisle | 307/603 |
| 5,245,231 | 9/1993 | Kocis | 307/606 |
| 5,252,867 | 10/1993 | Sorrells | 307/606 |

Primary Examiner—David R. Hudspeth
Assistant Examiner—Andrew Sanders
Attorney, Agent, or Firm—Conley, Rose & Tayon

[57] ABSTRACT

A variable drive strength buffer circuit is provided that automatically adjusts its associated drive strength to compensate for variations in manufacturing parameters, environmental conditions and operating conditions. As a result, electromagnetic interference, power supply noise, edge rates and ringing may be reduced. The self-adjusting variable drive buffer circuit may be fabricated on an integrated circuit and includes a speed detector unit that measures the relative speed of the integrated circuit. In one embodiment, a self-adjusting variable drive strength buffer circuit includes a circuit speed detector unit having a delay chain consisting of a plurality of variable delay elements. When the delay chain length is matched to the period of an input clock, the length of the chain is an accurate measure of the relative "speed" of the transistors making up the delay chain and therefore of the other transistors on the integrated circuit chip. The length of the delay chain is encoded into a vector (one or more digital bits of information) that controls the amount of drive that is provided in the variable drive buffer circuit. More drive is provided if the transistors on the chip are relatively slow and less drive is provided if the transistors are relatively fast.

6 Claims, 19 Drawing Sheets

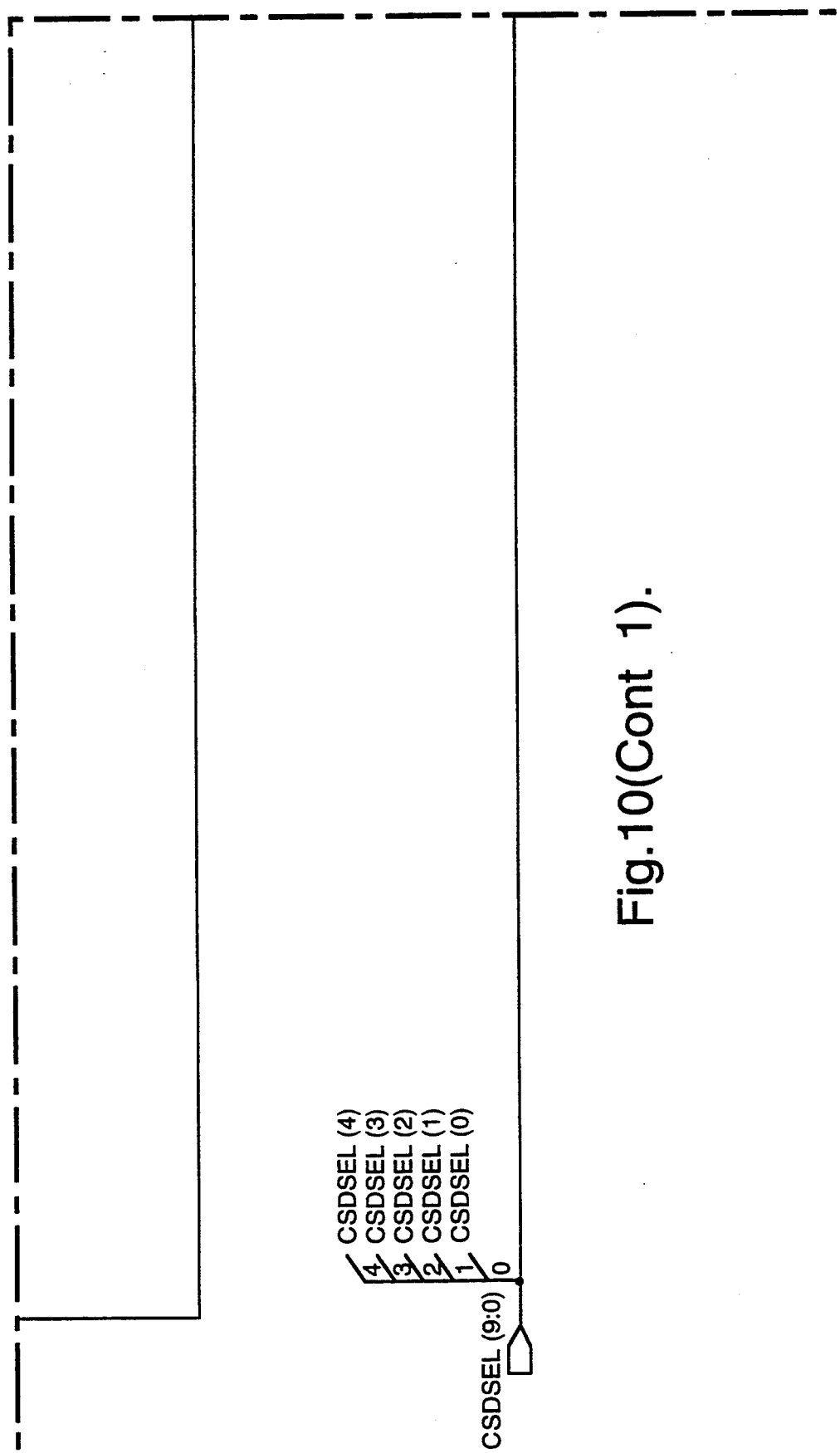

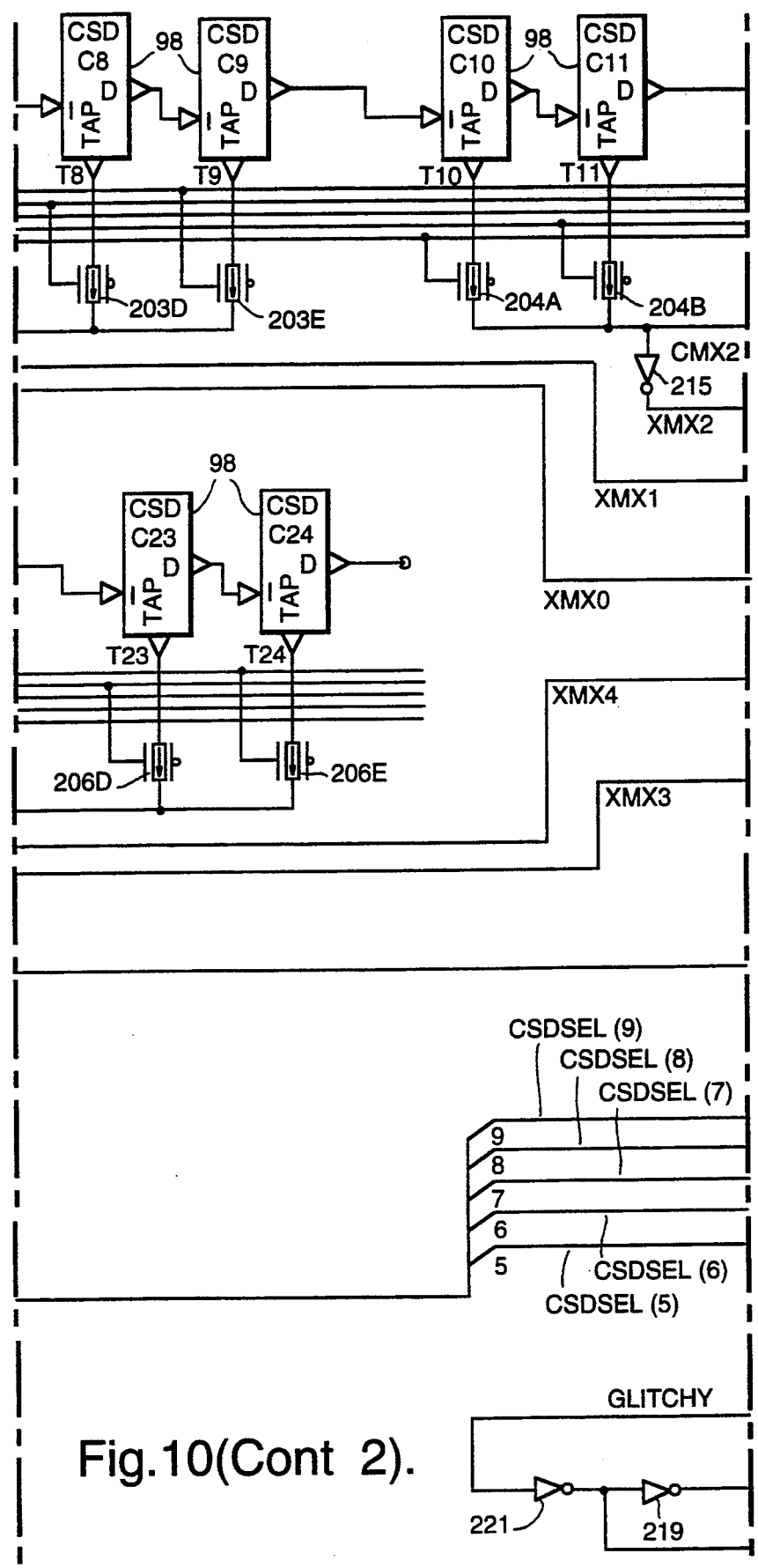
Fig.10(Cont 2).

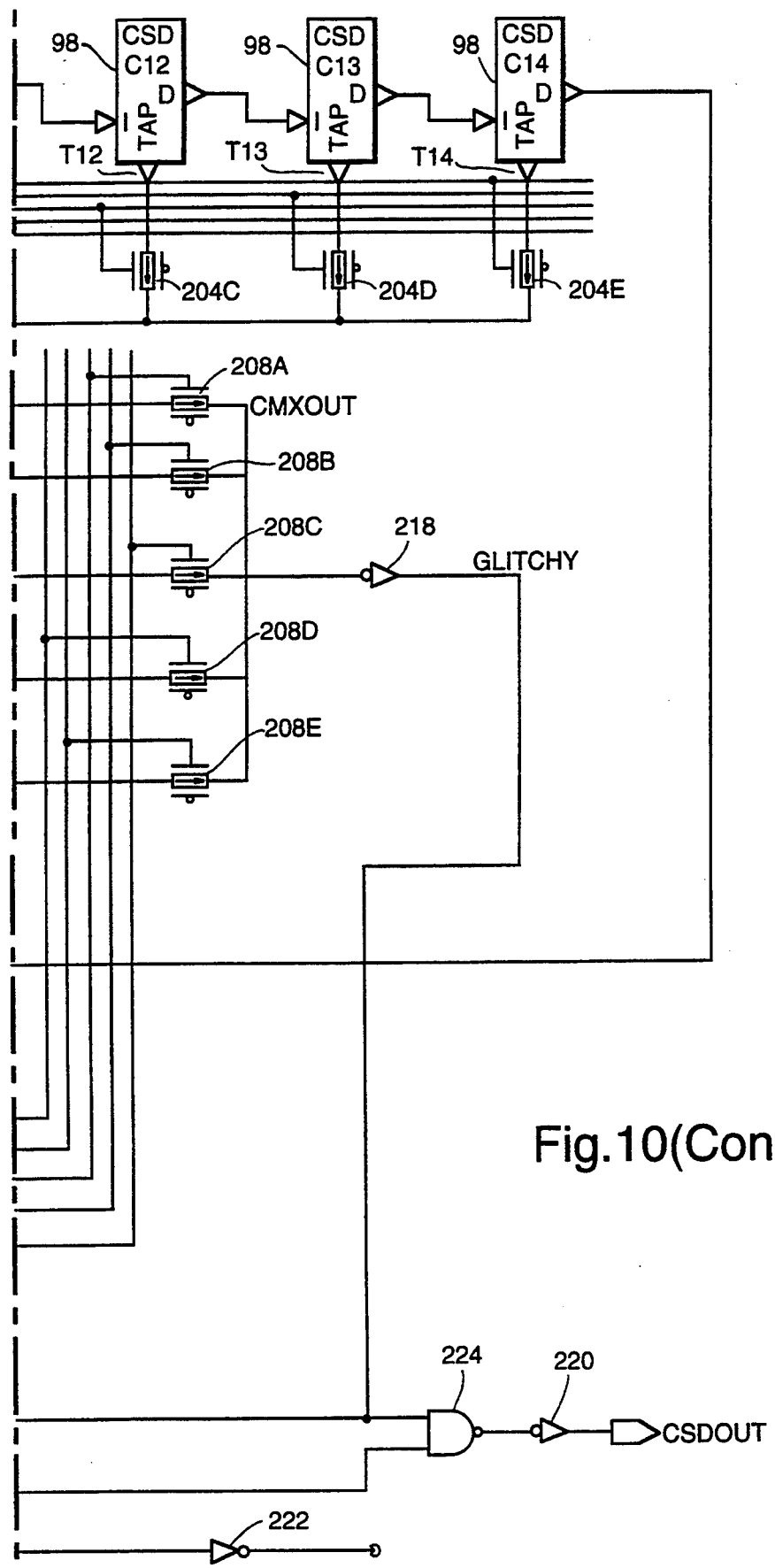
Fig.10(Cont 3).

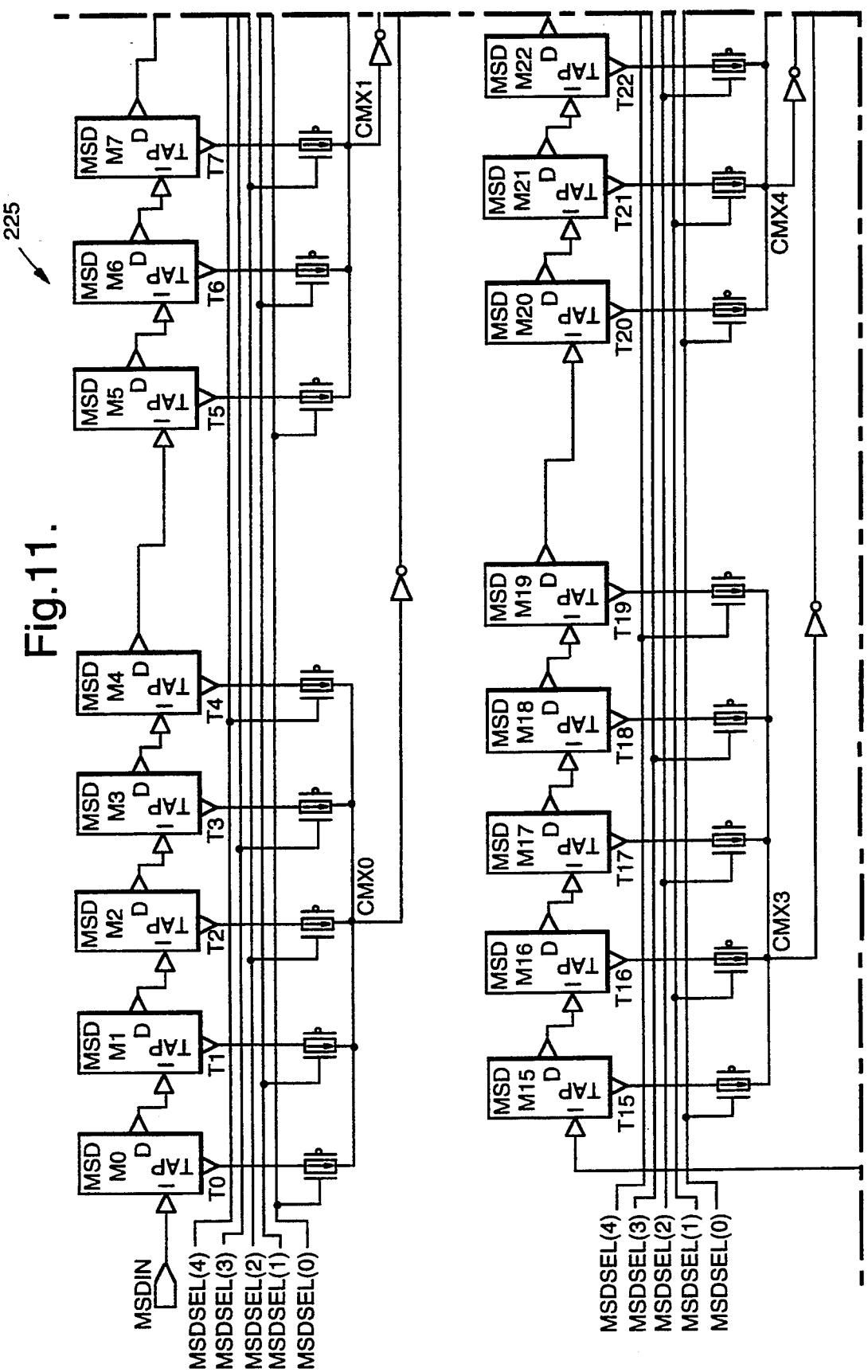

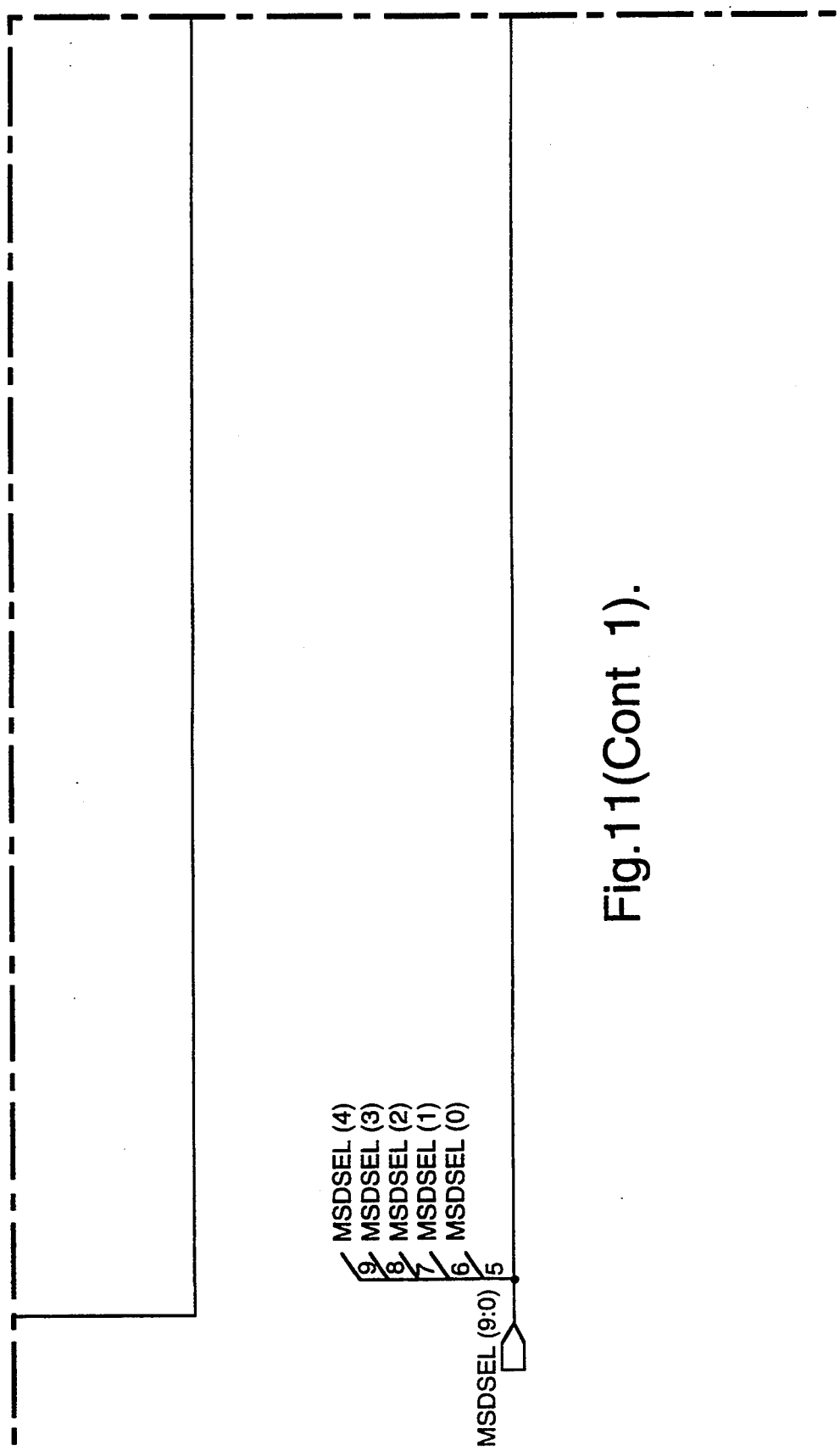

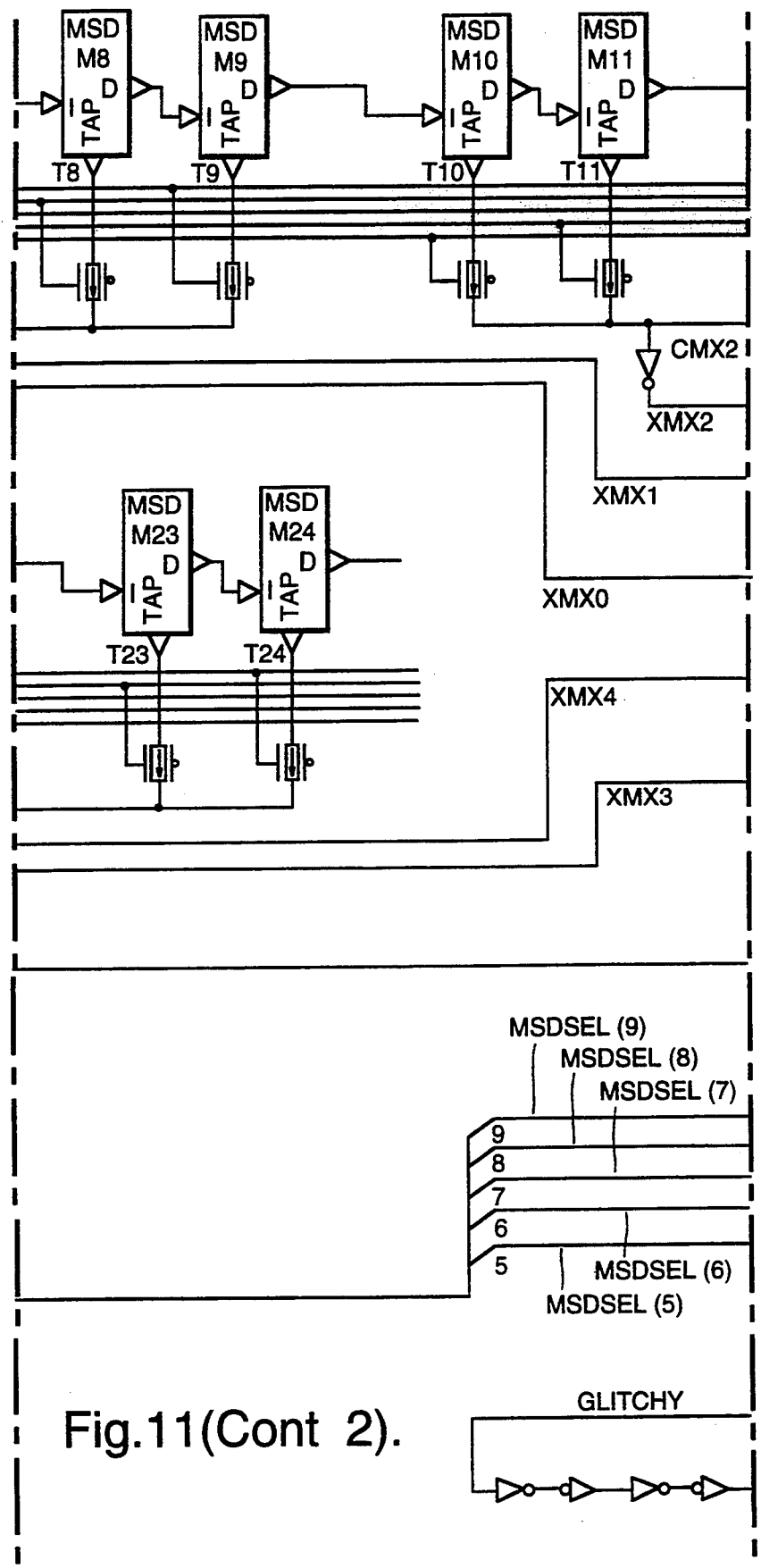
Fig.11(Cont 2).

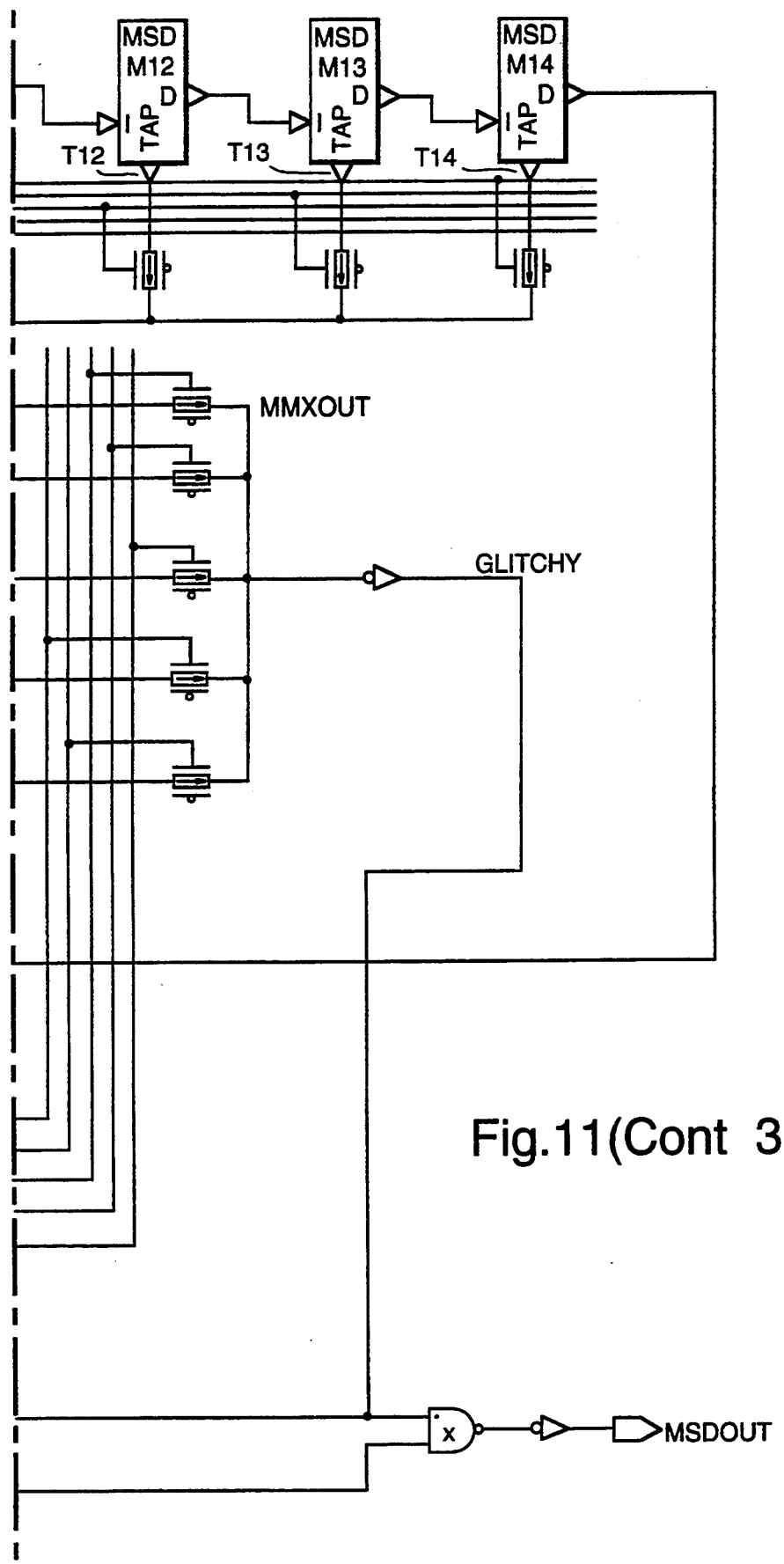
Fig.11(Cont 3).

SELF-ADJUSTING VARIABLE DRIVE STRENGTH BUFFER CIRCUIT AND METHOD FOR CONTROLLING THE DRIVE STRENGTH OF A BUFFER CIRCUIT

BACKGROUND OF THE INVENTION

1. Field of the Invention

This invention relates to buffer circuits employed in integrated circuits and, more particularly, to the automatic control of the drive strength of buffer circuits. The invention also relates to methods for controlling the drive strength of a buffer circuit.

2. Description of the Related Art

A digital circuit is fast or slow relative to the time allotted by the overall system requirements. In microprocessors, the time allotted to logic is usually measured in periods or fractions of a period. If a circuit is just fast enough to operate at 5 MHz, for example, then it is a "fast" circuit if used at an operating frequency of 1 MHz and a "slow" circuit if used at an operating frequency above 5 MHz.

For a given operating frequency, a circuit is fast or slow due to several factors. First, semiconductor processing variations give rise to variations in the speed of circuits. This, of course, is fixed for a given device, but the speed of a randomly selected device is not entirely predictable due to these manufacturing variations. Second, the operating temperature of a device affects its speed. This is a parameter that varies from application to application and also within a given application over time. The operating voltage of a device also affects its speed. This parameter also varies from application to application and over time within a given application.

Buffer circuits are logic gates in integrated circuits that have the primary function of driving signals. Two important examples of buffer circuits are circuits that drive clocks and circuits that drive semiconductor device outputs. In both of these instances, the buffer circuit provides the large drive currents necessary to quickly drive signals with relatively large loads.

In practice, such buffer circuits must be designed to drive the maximum expected load in the minimum expected time such that the semiconductor device can meet its specification under worst-case conditions and over the expected range of variation in relevant manufacturing parameters. However, during actual operation, the manufacturing parameters, operating conditions, operating frequencies and loads on these signals are often not worst-case. In such cases, the designed buffer drive strength is excessive. Excessive drive strength can be problematic in several ways.

Excessive drive strength on signals that carry periodic waveforms results in excessive electromagnetic interference (EMI). This in turn complicates the design of systems by requiring the addition of shielding or by requiring further optimizations to the design and layout of circuits in the system.

Excessive drive strength on signals also increases the amount of power supply noise present on the chip and in the system. This reduces noise margins in the system.

Lastly, excessive drive strength causes signals to have faster edge rates and more ringing. These characteristics create transmission line problems in the system which must be addressed by the system hardware designers.

SUMMARY OF THE INVENTION

In accordance with the present invention, a variable drive strength buffer circuit is provided that automatically adjusts its associated drive strength to compensate for variations in manufacturing parameters, environmental conditions and operating conditions. The self-adjusting variable drive buffer circuit may be fabricated on an integrated circuit and includes a speed detector unit that measures the relative speed of the integrated circuit. The invention advantageously allows the drive strength of the buffer circuit to dynamically adapt to the manufacturing parameters and operating conditions of a particular buffer circuit, rather than having a fixed drive strength that satisfies the requirements during worst-case conditions. As a result, electromagnetic interference, power supply noise, edge rates and ringing may be reduced.

In one embodiment, a self-adjusting variable drive strength buffer circuit includes a circuit speed detector unit having a delay chain consisting of a plurality of variable delay elements. When the delay chain length is matched to the period of an input clock, the length of the chain is an accurate measure of the relative "speed" of the transistors making up the delay chain and therefore of the other transistors on the integrated circuit chip. As transistors on the chip become faster, for example, the length of the delay chain is increased to compensate for the faster propagation time through each element of the delay chain. The delay chain is also increased or decreased in length to account for relatively static parameters such as operating frequency and semiconductor device manufacturing variations. The length of the delay chain is encoded into a vector (one or more digital bits of information) that is utilized as a measure of the relative speed of the integrated circuit chip with respect to parameters such as manufacturing variations, operating frequency, operating voltage and operating temperature. The vector controls the amount of drive that is provided in the variable drive buffer circuit. More drive is provided if the transistors on the chip are relatively slow and less drive is provided if the transistors are relatively fast.

These and other advantages are achieved with the present invention, in accordance with which a self-adjusting buffer circuit fabricated on an integrated circuit comprises a speed detector unit that generates a control signal indicative of a relative speed of the integrated circuit. The self-adjusting buffer circuit further comprises a buffer unit including an input terminal, an output terminal, and a control terminal, wherein the control terminal is coupled to the speed detector unit and wherein a drive strength of the buffer unit varies in response to the control signal.

In accordance with another aspect of the invention, a self-adjusting buffer circuit comprises a delay chain including an input node and an output node, wherein a propagation delay between the input node and the output node is variable and is dependent upon a delay select signal. A control unit is provided for generating the delay select signal and is coupled to the delay chain. The delay select signal controls the propagation delay of the delay chain such that a period of a timing signal provided to the input node of the delay chain substantially equals the propagation delay of the delay chain. A buffer unit is further provided including an input terminal, an output terminal, and a control terminal, wherein a control signal indicative of the delay select signal is provided to the control terminal and wherein a drive strength of the buffer unit varies in response to the control signal.

In accordance with yet another aspect of the invention, a method for controlling the drive strength of a buffer circuit fabricated on an integrated circuit comprises the steps of detecting a relative speed of the integrated circuit, generating a control signal indicative of the relative speed of the integrated circuit, and varying the drive strength of the buffer circuit in response to the control signal.

In accordance with still a further aspect of the invention, a method for controlling the drive strength of a buffer circuit comprises the steps of generating a timing signal having a plurality of signal transitions, providing the timing signal to a variable delay element including a signal propagation path between an input node and an output node, and controlling a propagation length of the propagation path of the variable delay element such that a period of the timing signal substantially equals the propagation delay of the variable delay element. The method includes the further step of adjusting the drive strength of the buffer circuit depending upon the propagation length of the variable delay element.

The invention will be more readily understood with reference to the drawings and the detailed description. As will be appreciated by one skilled in the art, the invention is applicable to buffer circuits in general and is not limited to a specific embodiments disclosed.

BRIEF DESCRIPTION OF DRAWINGS

FIG. 11 is a schematic diagram of a medium delay adjust circuit within the variable length delay circuit that allows medium delay increments.

DETAILED DESCRIPTION

The following includes a detailed description of the best presently contemplated modes for carrying out the invention. The description is intended to merely illustrative of the invention and should not be taken in a limiting sense.

Figure 1:
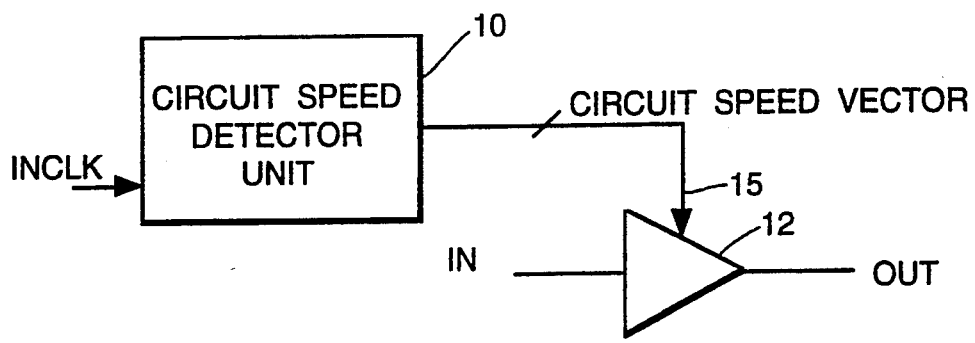
FIG. 1 is a block diagram of a self-adjusting variable drive strength buffer circuit.

Referring to FIG. 1, a block diagram is shown of a self-adjusting variable drive strength buffer circuit fabricated on an integrated circuit. The circuit includes a speed detector unit 10 that monitors the relative speed of the integrated circuit and a variable drive buffer unit 12 that provides a buffer between an input signal at a line labeled IN and a buffered signal at a line labeled OUT. The speed detector unit 10 includes means for measuring the speed of the integrated circuit relative to the period of an input clock signal labeled INCLK and generates one or more control signals indicative of the speed. In this embodiment, these control signals are digital bits of information referred to collectively as the "circuit speed vector". The variable drive buffer unit 12 receives the circuit speed vector and responsively provides an associated drive strength that is dependent upon the circuit speed vector. As will be more fully appreciated from the description below in conjunction with FIG. 3, the circuit speed vector generated by the speed detector unit 10 may vary in response to variations in parameters such as manufacturing processes, operating frequency, operating voltage and operating temperature. If the relative speed of the integrated circuit as detected by the speed detector unit 10 is slow, the drive strength of the variable drive buffer unit 12 is increased. On the other hand, if the relative speed of the integrated circuit is fast, the drive strength is decreased. Thus, since the drive strength of the buffer circuit is dynamically adjusted in accordance with the relative circuit speed, electromagnetic interference, power supply noise, edge rates, and ringing may be advantageously reduced.

Figure 2:
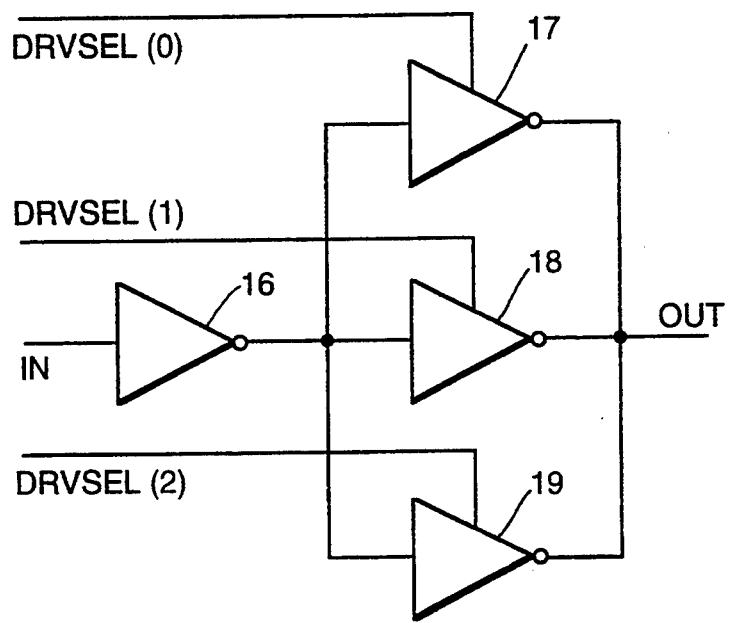
FIG. 2 is a schematic diagram of a variable drive strength buffer unit.

FIG. 2 is a schematic diagram illustrative of the variable drive buffer unit 12. The circuit includes an inverter 16 and tri-state buffers 17–19. In this implementation, a circuit speed vector is comprised of three signals labeled DRVSEL(2:0), and each is provided to an enable line of an associated tri-state buffer 17–19. The allowed values of the circuit speed vector DRVSEL(2:0), as well as the resulting drive strength of the variable drive buffer unit 12, are listed in Table I below:

TABLE I

| | |
|---|---|
| 001 | minimum drive strength |
| 011 | medium drive strength |
| 111 | maximum drive strength |

It is noted that since the tri-state buffers 17–19 are coupled in parallel, as more tri-state buffers are enabled, more drive strength is provided at the OUT line. It is also noted that a greater degree of drive strength variability and resolution may be provided by increasing the number of tri-state buffers coupled in parallel. Such variations do not depart from the spirit and scope of the invention.

Figure 3:
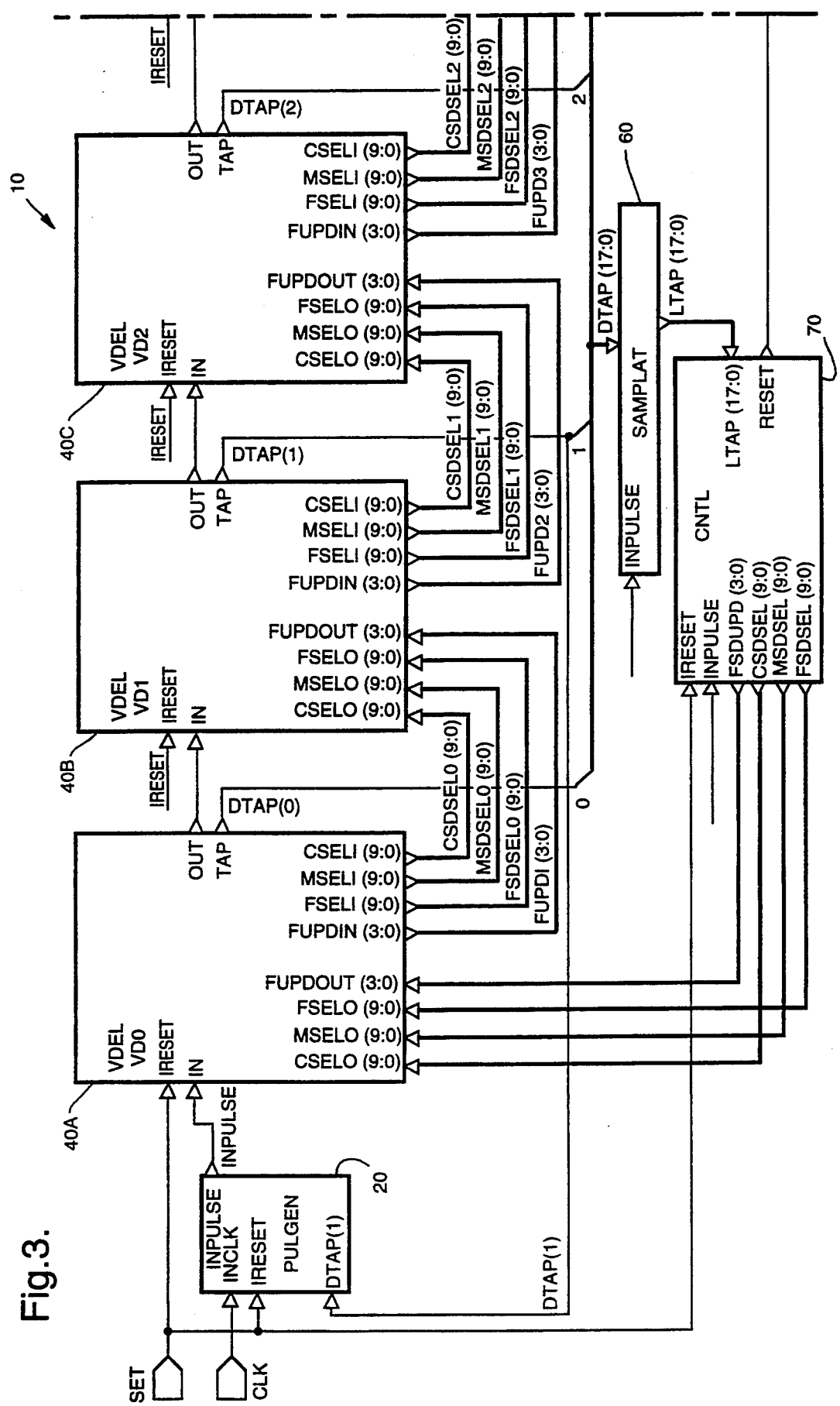
FIG. 3 is a block diagram of a speed detector unit.
Figure 3:
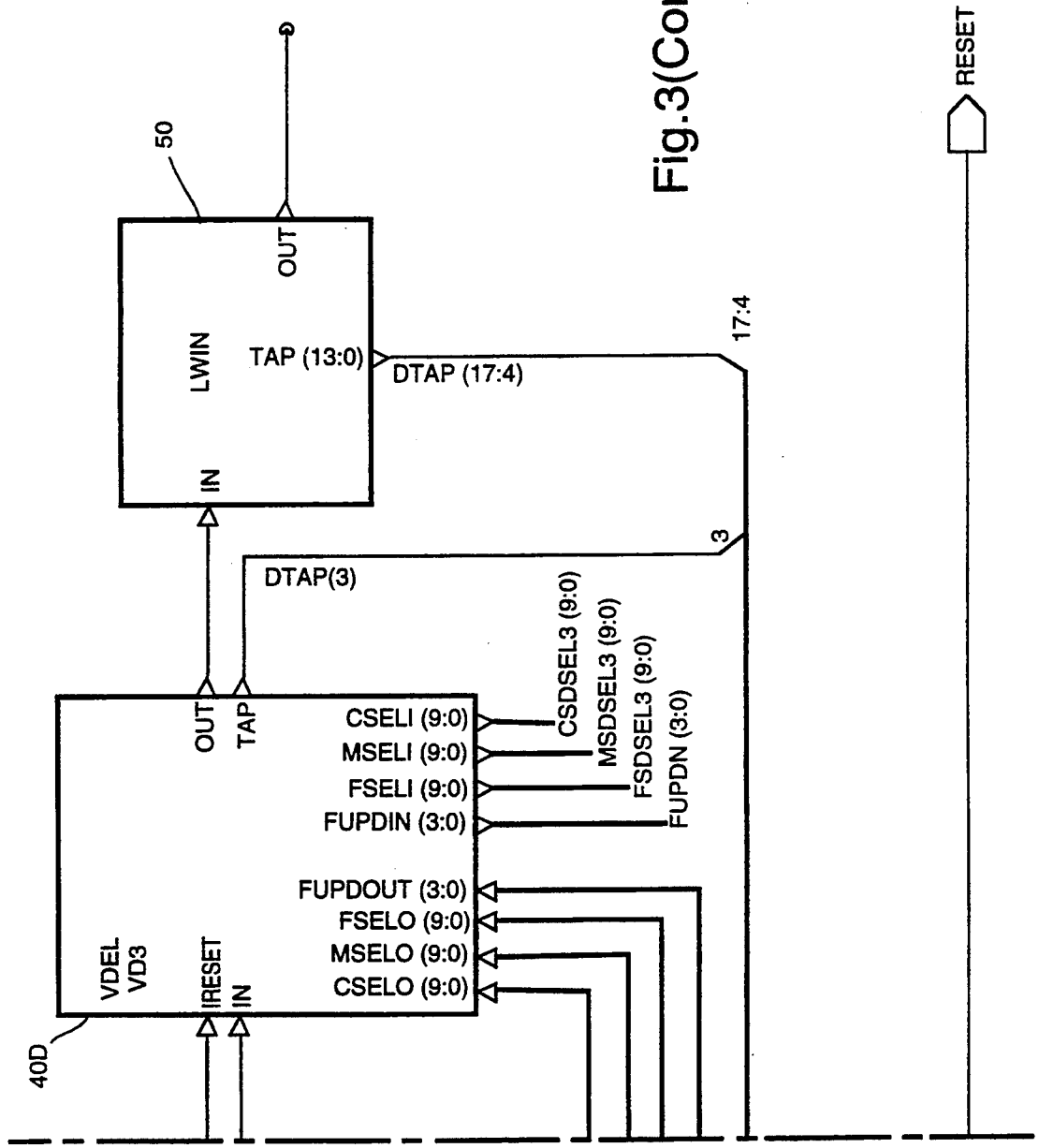

An embodiment of a speed detector unit 10 is next considered. FIG. 3 is a block diagram of a speed detector unit that generates a circuit speed vector signal indicative of the relative speed of the integrated circuit. The speed detector unit 10 includes a pulse generator unit 20 labeled PULGEN and a delay chain section composed of a plurality of variable length delay units 40A–40D, each labeled VDEL. The speed detector unit 10 further includes a lock window unit 50 labeled LWIN, a sampling latch unit 60 labeled SAMPLAT, and a control unit 70 labeled CNTL.

Following an initialization sequence (to be described later), the speed detector unit 10 operates in the following manner. Signal INCLK, an externally generated clock signal provided to the circuit, is provided to the PULGEN unit 20 that correspondingly generates a pulsing signal labeled INPULSE. Signal INPULSE can be thought of as a string of pulses, each with a rising edge and a falling edge, and having the same period as signal INCLK.

Each VDEL unit 40A–40D includes an input terminal labeled IN and an output terminal labeled OUT, and each is associated with a propagation delay referred to as a "delay path length" that is controllable by means of a series of control signals provided to each unit. The VDEL units 40A–40D are coupled in series with respect to one another such that each pulse of the signal INPULSE fed into the first VDEL unit 40A ultimately propagates in turn through each of the other three VDEL units 40B–40D. The overall delay path length through the four VDEL units 40A–40D is adjusted such that it matches the period of signal INCLK. Details of this adjustment operation will be described below. At this point, it is sufficient to say that the length of the delay chain is continuously adjusted to dynamically compensate for changing environmental parameters such as temperature and operating voltage. It is noted that the propagation time through the delay chain can vary either because the intrinsic delay is being changed by the control unit 70 through the addition or substraction of delay elements or because the changing environmental conditions are affecting the propagation time through each delay element. These environmental conditions are relatively slowly changing and can be compensated for by the delay chain control.

It is noted that in this embodiment, each of the VDEL units 40A–40D is characterized with an equal delay with respect to the others. Such a characterization is not essential; the control of the VDEL units 40A–40D could be modified such that each VDEL unit would be associated with a different delay.

After each pulse propagates through the four VDEL units 40A–40D, the pulse propagates from an input terminal of the lock window unit 50 labeled IN through to its output terminal labeled OUT. A tap point is provided from each VDEL unit 40A–40D that is essentially representative of the output signal of each VDEL unit. As used herein, the term "tap point" or "tap" refers to a circuit node along a propagation path within, for example, the delay chain or lock window. The four taps provided from the VDEL units 40A–40D are labeled DTAP(3:0). There are fourteen additional taps labeled DTAP (4:17) provided from the lock window unit 50. The combination of these eighteen taps provide some visibility into various portions of the delay chain and greater visibility into the lock window. This will be better understood from the following.

Figure 4:
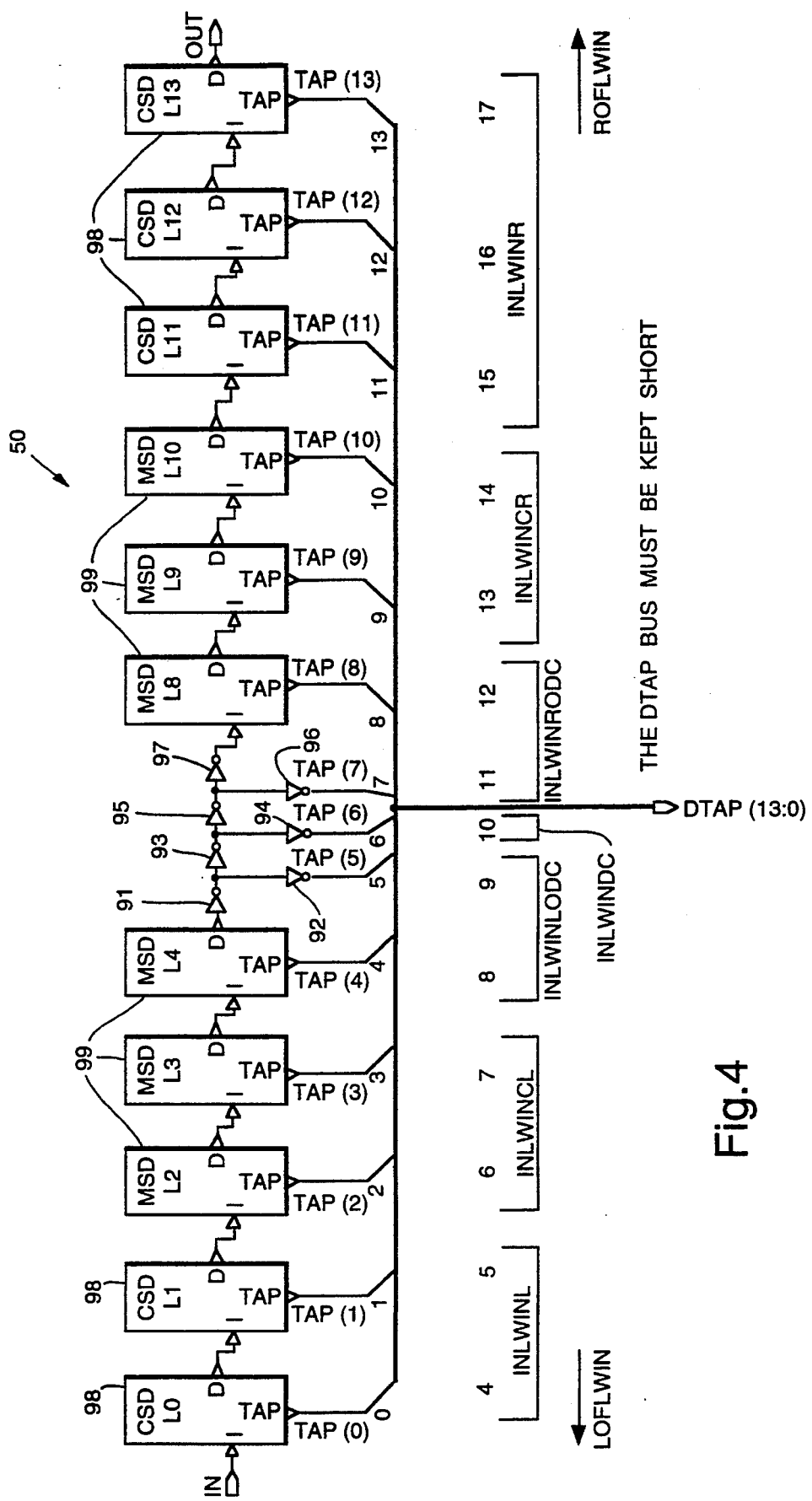
FIG. 4 is a schematic diagram of a lock window unit that includes a plurality of tap points arranged such that the position of the rising edge of a pulse waveform can be located.
Figure 5:
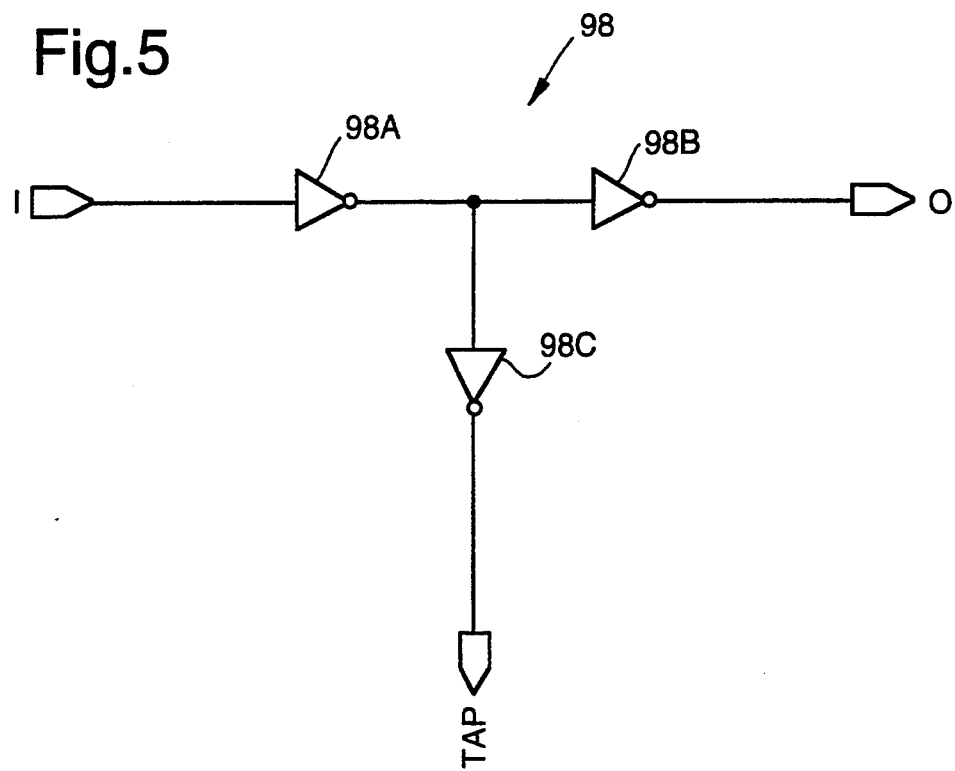
FIG. 5 is a schematic diagram of a coarse delay unit.
Figure 6:
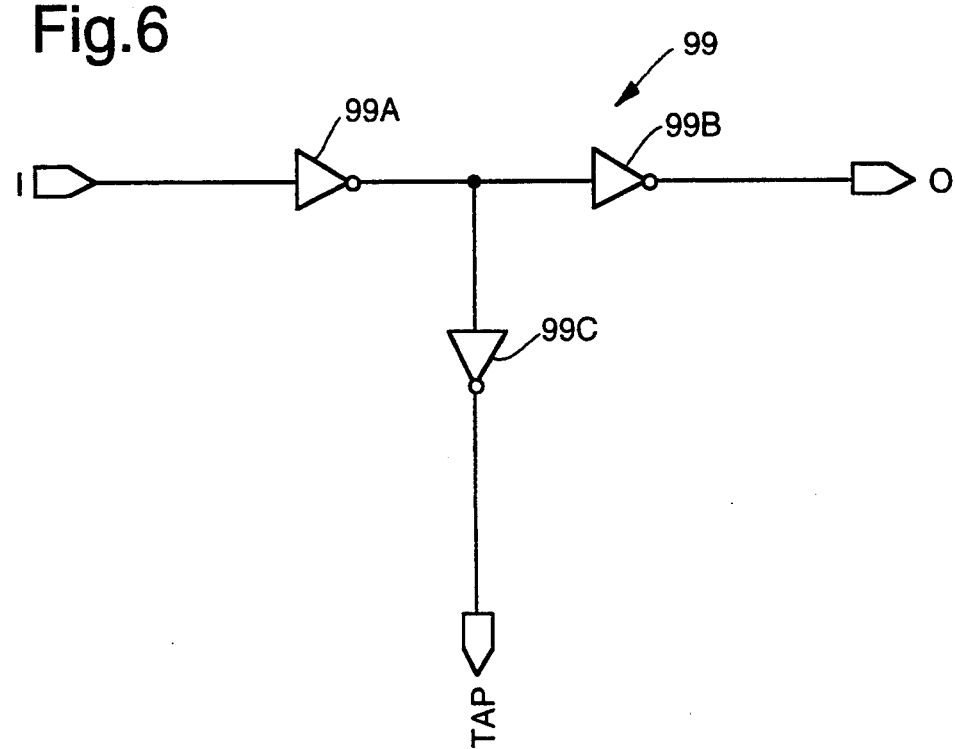
FIG. 6 is a schematic diagram of a medium delay unit.

Referring to FIG. 4, a schematic diagram is shown of the lock window unit 50. It is evident that the lock window unit 50 itself is a delay chain made up of various delay elements. These delay elements include inverters 91–97, a plurality of coarse delay units 98 labeled CSD, and a plurality of medium delay units 99 labeled MSD. FIG. 5 is a schematic diagram illustrating each CSD unit 98, and FIG. 6 is a schematic diagram illustrating each MSD unit 99. The CSD units 98 and MSD units 99 in this embodiment each include a pair of series connected inverters (98A, 98B, 99A, 99B) with a third inverter (98C, 99C) providing a tap point. The CSD units 98 are designed in this embodiment to have a propagation delay about five times that of the MSD units 99. The MSD units 99 in turn have a delay approximately equal to two normal inverters. That is, the inverters 98A and 98B of the CSD units 98 each have a delay approximately five times the delays of inverters 99A and 99B of the MSD units 99, and inverters 99A and 99B are designed to have a delay equal to the normal logic inverters fabricated on the integrated circuit.

As the pulse travels through the lock window unit 50, it passes into the I input of the respective CSD and MSD units and passes out through the O output. The O output of each CSD and MSD unit is coupled to the I input of the next element in the delay chain. In the approximate center of the lock window are discrete inverters 91–97. From the arrangement of the delay elements in the lock window 50 it is evident that the resolution in the lock window is finer near the center of the window and more coarse at the ends. The discrete inverters 91–97 used at the center of the window serve to maximize the resolution at that point.

Figure 7:
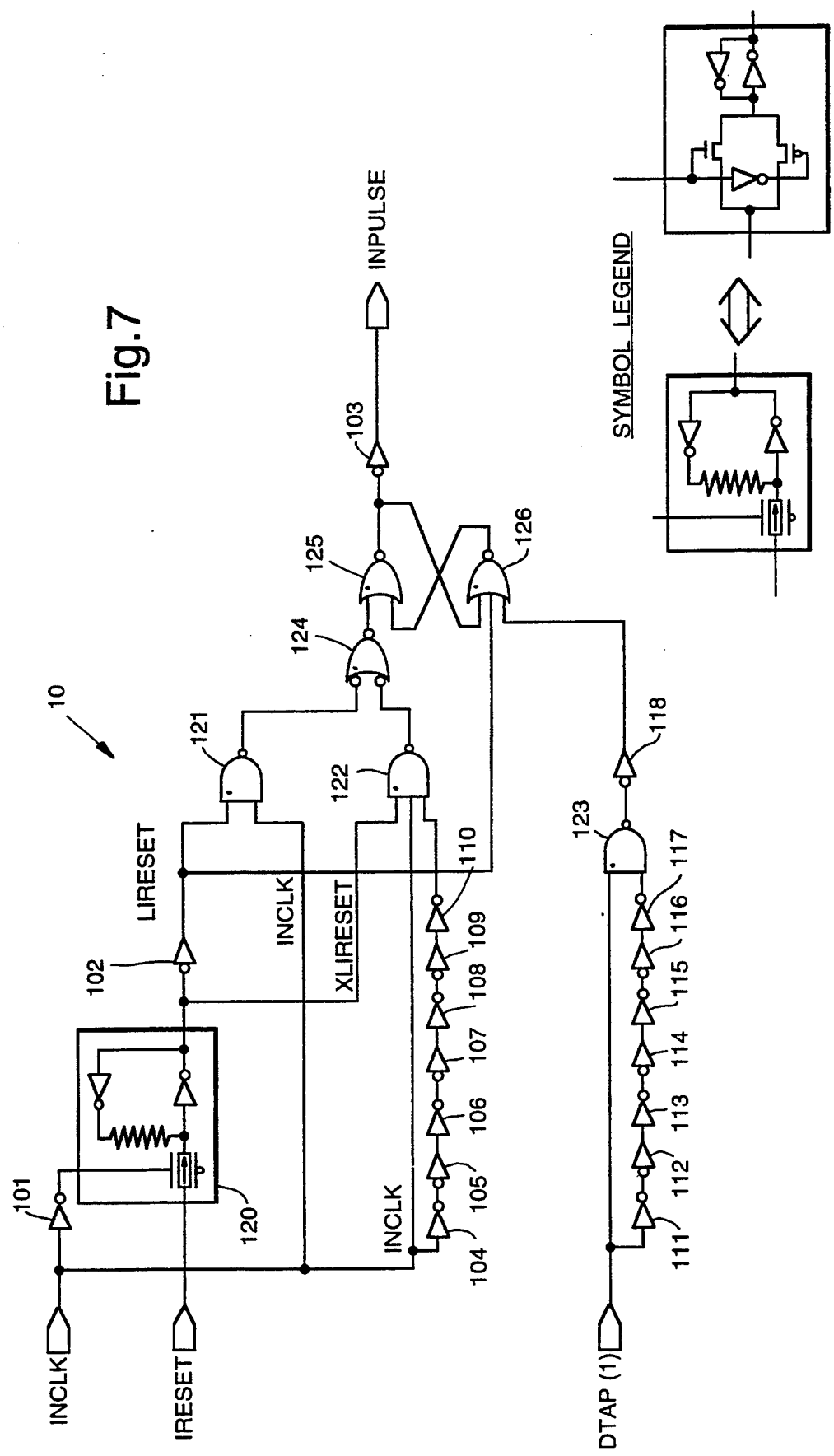
FIG. 7 is a schematic diagram of a pulse generator unit that receives an external clock signal and generates a pulse that is provided to a delay chain.

As stated previously with reference to FIG. 3, the PULGEN block 20 generates a continuous stream of pulses that are sent down the VDEL delay chain and through the lock window 50 at the end of the VDEL chain. FIG. 7 is a schematic diagram illustrating the PULGEN unit 20. The circuit includes a plurality of inverters 101–118, a latch 120, NAND gates 121–124, and NOR gates 125 and 126.

It is noted that NOR gates 125 and 126 form a second latch circuit. When signal IRESET is high, the circuit is in a reset mode. Therefore, the output line of NAND gate 122 is held high and the output line of NOR gate 126 remains low regardless of signal DTAP(1). Signal INPULSE is therefore directly derived from signal INCLK as the result of the switching of the output states of NAND gates 121 and NOR gate 124.

When signal IRESET goes low, the output of NAND gate 122 goes low for a short duration upon a rising edge of signal INCLK. This causes the output of NOR gate 124 to go high, thereby latching signal INPULSE high. When signal INCLK goes low, the output of NAND gate 122 remains high, as does signal INPULSE. When signal DTAP(1) goes high, NAND gate 123 pulses low momentarily, thereby driving the output of NOR gate 126 low. This latches the output of NOR gate 125 high, thereby causing signal INPULSE to go low. Signal INPULSE will return high upon the next rising edge of signal INCLK.

It is also noted that the INPULSE waveform has a period identical to that of INCLK. In the steady state, the INPULSE waveform has a duty cycle that is close to 50%. The 50% duty cycle is achieved by forcing signal INPULSE to go high upon the rising edge of signal INCLK and forcing it to go low upon the rising edge of signal DTAP(1). DTAP(1) is halfway down the VDEL chain. Therefore, since in the steady state the VDEL chain length has been adjusted to match the period of signal INCLK, signal INPULSE will go low half an INCLK period after it goes high.

Referring back to FIG. 3, the eighteen tap points from the delay chain are latched in the sampling latch unit 60 (SAMPLAT). These tap portions are latched upon the occurrence of a delayed version of the rising edge of signal INPULSE. The reason for this delay is as follows. When the "current" rising edge of signal INPULSE is arriving at the input of the first VDEL unit 40A, the previous rising edge of signal INPULSE has propagated down the chain and is leaving the fourth VDEL unit 40D. In order to determine the location of this previous pulse with high resolution, the sampling latch unit 60 delays the rising edge of the current pulse of signal INPULSE by an amount exactly equal to the delay between the beginning and the middle of the lock window unit 50. When this slightly delayed rising edge (called signal XDINCLK in the sampling latch unit 60 of FIG. 8) is used to latch the delay chain taps, the delayed previous edge location in the chain has the same temporal relationship to the output of the fourth VDEL unit 40D as the delayed current edge has to the input of the first VDEL unit 40A. Thus the 18-bit latched tap point vector is an image of the previous edge in the chain. When the delay through the 4 VDEL units 40A–40D matches the INCLK period, then the center of the latched lock window corresponds to exactly one INCLK period after the current rising edge of signal INPULSE enters the first VDEL unit 40A.

Figure 8:
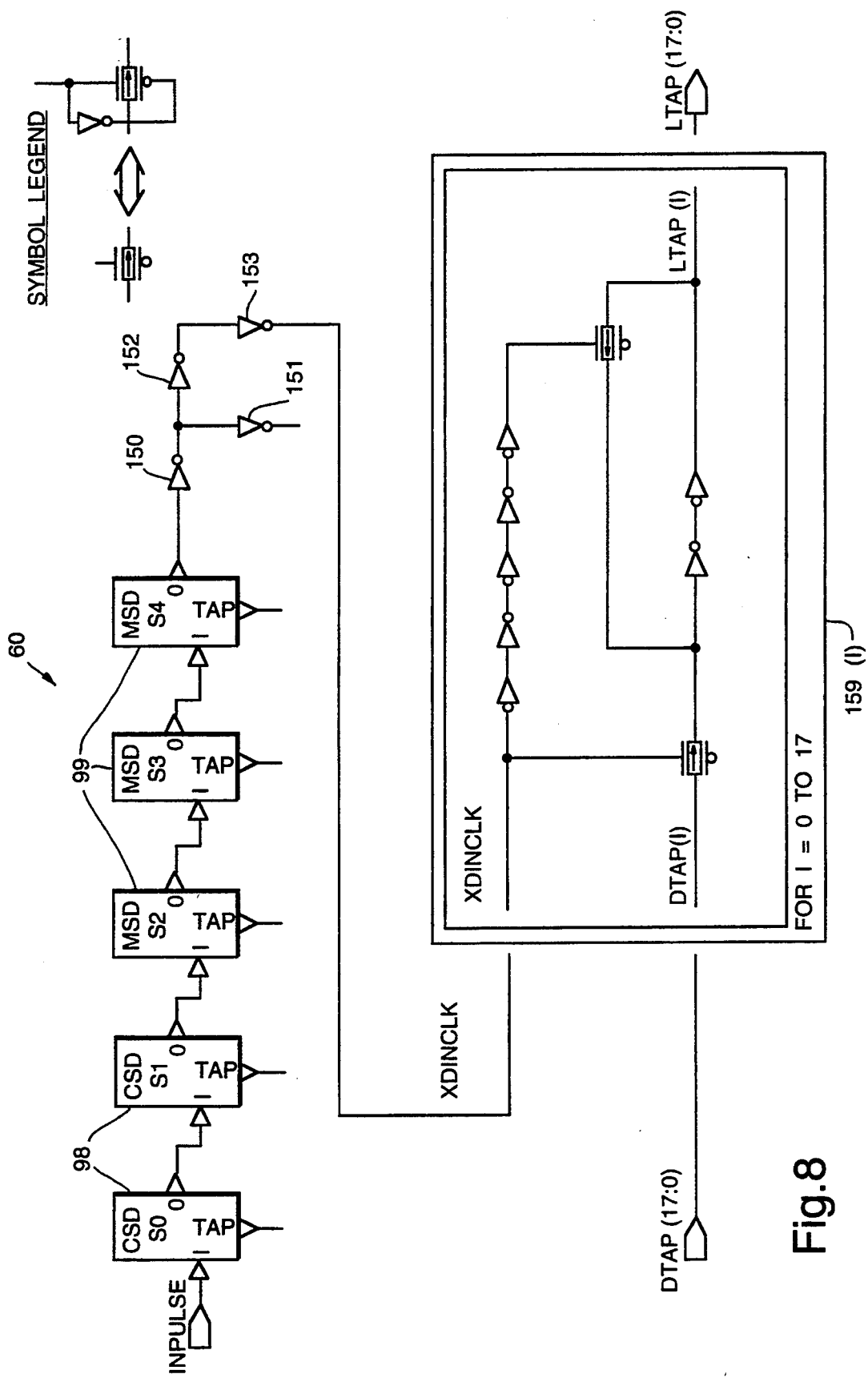
FIG. 8 is a schematic diagram of a sampling latch circuit that samples the tap points along the delay chain. The latch vector of tap points is analyzed in a state machine to determine how the length of the delay chain should be adjusted.

FIG. 8 is a schematic diagram illustrating the sampling latch unit 60. The circuit includes a pair of coarse delay units 98 labeled CSD, three medium delay units 99 labeled MSD and inverters 150–153. It is evident that these delay components are identical to those within the first half of the propagation path within the lock window unit 50. The circuit further includes eighteen separate latch units 159(I) (where I=0, 1 . . . 17), each having an input line coupled to one of the eighteen lines of the bus DTAP(17:0). Each of the latch circuits 159(I) also includes an output line coupled to a separate line of a bus LTAP(17:0).

Each of the latches 159(I) latches a new tap value upon the rising edge of signal XDINCLK. As stated previously, signal XDINCLK is a version of signal INPULSE that is delayed by an amount exactly equal to the delay between the beginning and the middle of the lock window unit 50. As a result, the delayed previous edge location of a pulse in the delay chain has the same temporal relationship to the output of the fourth VDEL unit 40D as the delayed current edge has to the input of the first VDEL unit 40A. It is noted that the first CSD unit 98 within the sampling latch unit 60 should be positioned near the location where signal INPULSE enters the first VDEL unit 40A. Furthermore, the lines comprising the bus DTAP (17:0) should be kept short. Signal XDINCLK should also be routed across the eighteen latches 159(I) from bit 17 to bit 0, in that order. These features may help to ensure that the tap vector is latched at the proper time.

When the latched delay taps LTAP(17:0) indicate that the rising edge of the traveling pulse was between LTAP(9) and LTAP(11) (also labeled TAP(5) and TAP(7) respectively in FIG. 4), then the delay chain comprised of the VDEL units 40A–40D has been adjusted so that its length matches the period of signal INPULSE (and therefore of signal INCLK). The delay chain is said to be "in lock" at this point.

If the chain is "in lock" and the latched delay tap vector (bus LTAP(17:0) in FIG. 3) is examined, logical low signals (zeros) will be to the right of the center of the lock window. The rising edge has not propagated there yet. To the left of the center of the lock window will be logical high signals (ones); the rising edge has gone by and the traveling pulse is high in that part of the chain. Further to the left of the lock window, at DTAP(1), will be seen a zero. This is the next falling edge propagating through the chain. The "current" rising edge will have propagated into the first VDEL unit 40A (since the LTAP(17:0) vector was latched with a delayed version of signal INPULSE). The current rising edge may or may not have propagated to the DTAP(0) point, depending on the frequency of the input clock and the speed of the delay chain. Note that in the center of the lock window there is only one inversion between tap points 9, 10 and 11 (also labeled 5, 6 and 7 in FIG. 4). Because of this, the sense of tap point 10 is inverted relative to the other tap points. This inversion occurs in the control unit 70.

If the delays of the VDEL units 40A–40D have been adjusted so that the cumulative delay through all four VDEL units is less than the period of signal INCLK, then the latched tap vector (LTAP, FIG. 1) will indicate that the rising edge location is to the right of (after) the center of the lock window. If the VDEL delay is small enough, the edge will not be seen in the lock window at all; it has passed beyond the lock window before the next rising edge of signal INPULSE latches the delay taps. Likewise if the VDEL delays are larger than that necessary to match the period of signal INCKL, the rising edge of the traveling pulse will appear to the left of (before) the center of the lock window.

The location of the rising edge in the latched delay tap vector is therefore an indication of how closely the cumulative VDEL delay matches the INCLK period. The state of the LTAP vector is used to make a decision about modifying the delay of VDEL units 40A–40D. This decision-making logic is located in control block 70. The control block 70 produces four vectors that together determine the amount of delay in each VDEL unit: CSDSEL(9:0), MSDSEL(9:0), FSDSEL(9:0) and FSDUPD(3:0).

Figure 9:
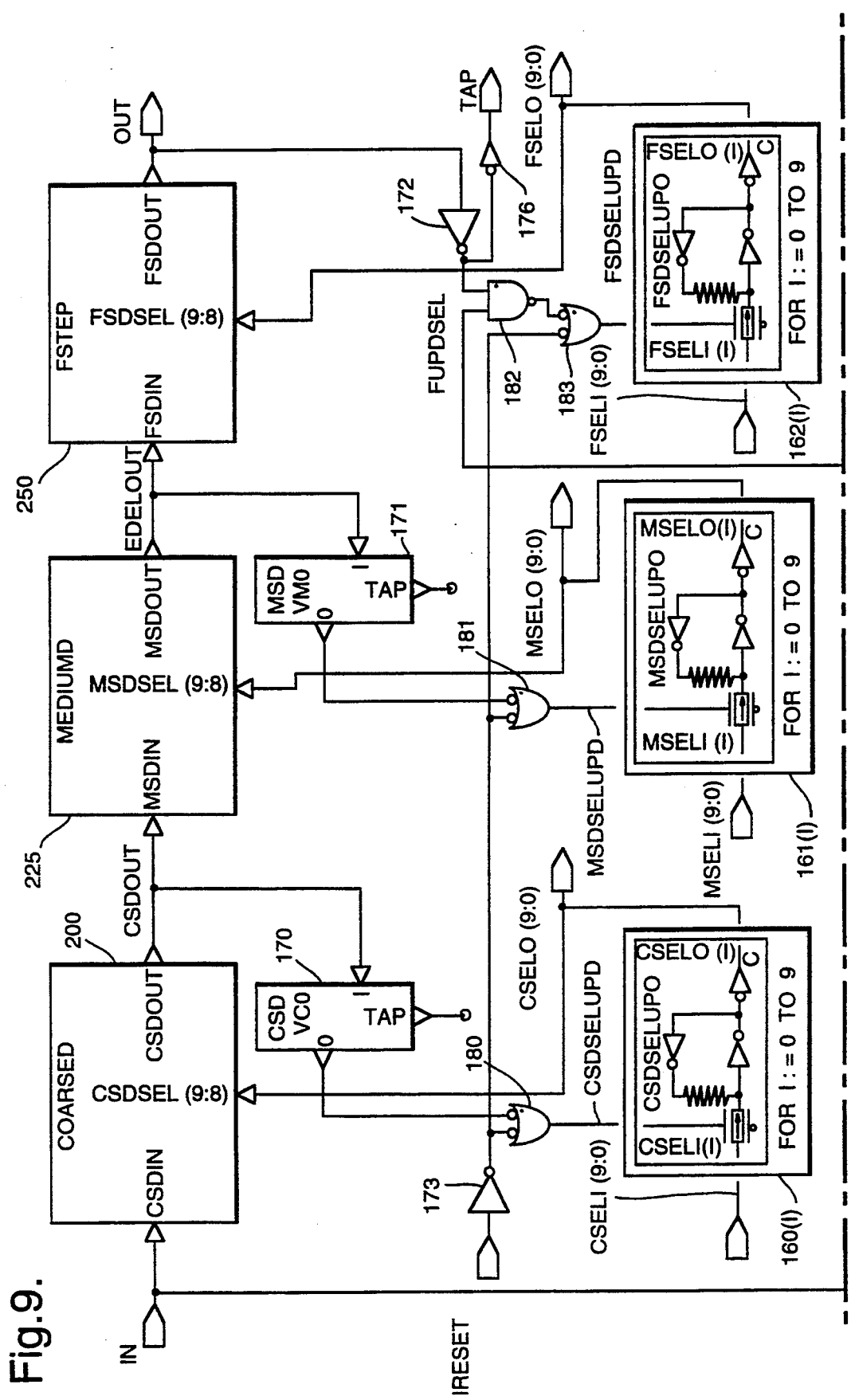
FIG. 9 is a schematic diagram of a variable length delay circuit.
Figure 9:
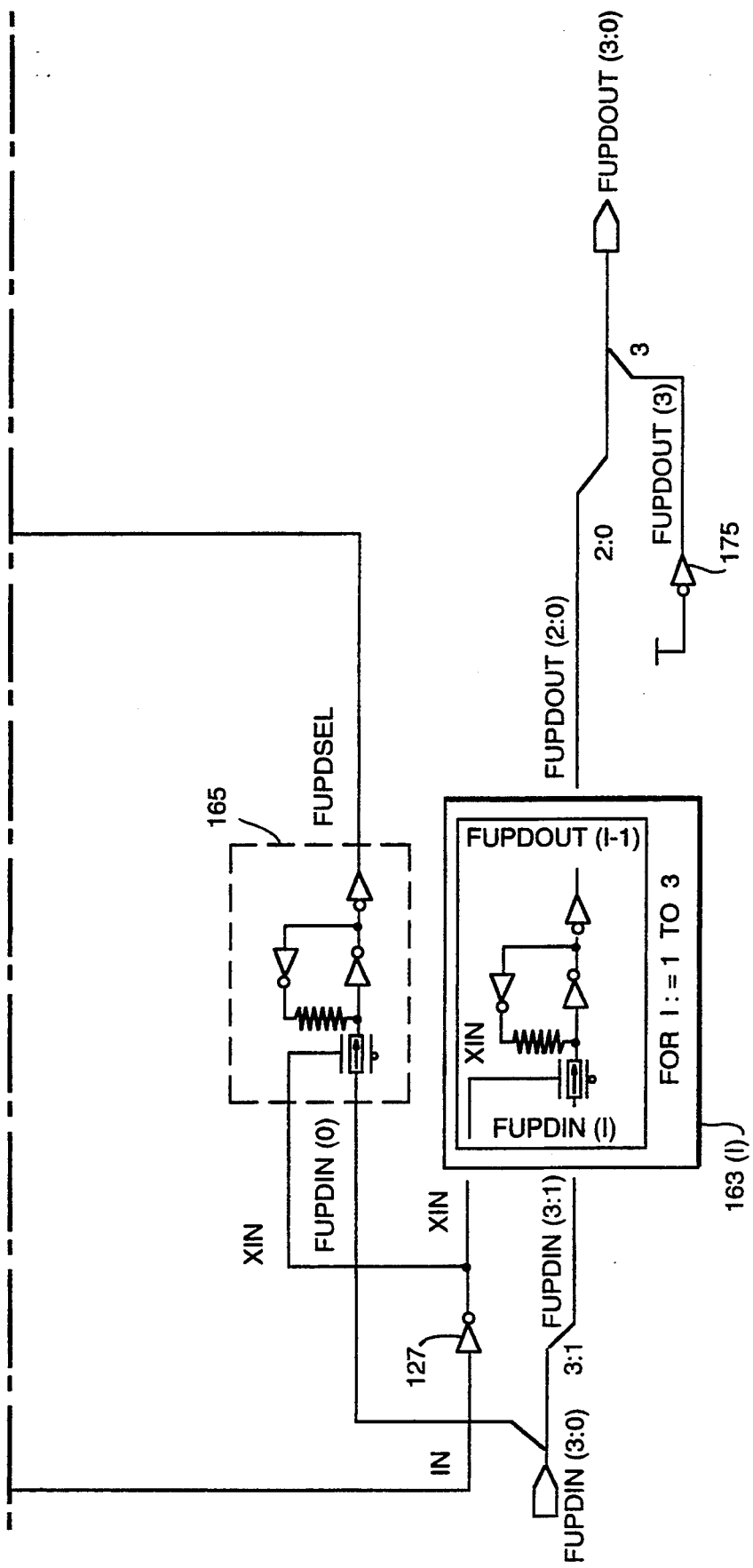

The internal components of the VDEL units 40A–40D are next considered with reference to FIGS. 9–12. Referring first to FIG. 9, in this embodiment each VDEL unit includes three primary delay components. A first of these components is a coarse delay adjust circuit 200 (CoarseD) that varies the delay through the unit in coarse steps. A second component is a medium delay adjust circuit 225 (MEDIUM) that varies the delay through the unit in medium steps. The last component is a fine delay adjust circuit 250 (FSTEP) that varies the delay in fine steps. Each of these three components receives a 10-bit delay select vector as an input. These vectors control the length of the delay through the three components.

The VDEL unit of FIG. 9 also includes three sets of latch circuits 160(I), 161(I), and 162(I) (where i=0, 1, . . . 9), and a fourth set of latches 163(I) (where i=1, 2 and 3). The VDEL unit further includes a latch 165, a coarse delay unit (CSD unit) 170, a medium delay unit (MSD unit) 171, inverters 172–176, and NAND gates 180–183.

Figure 10:
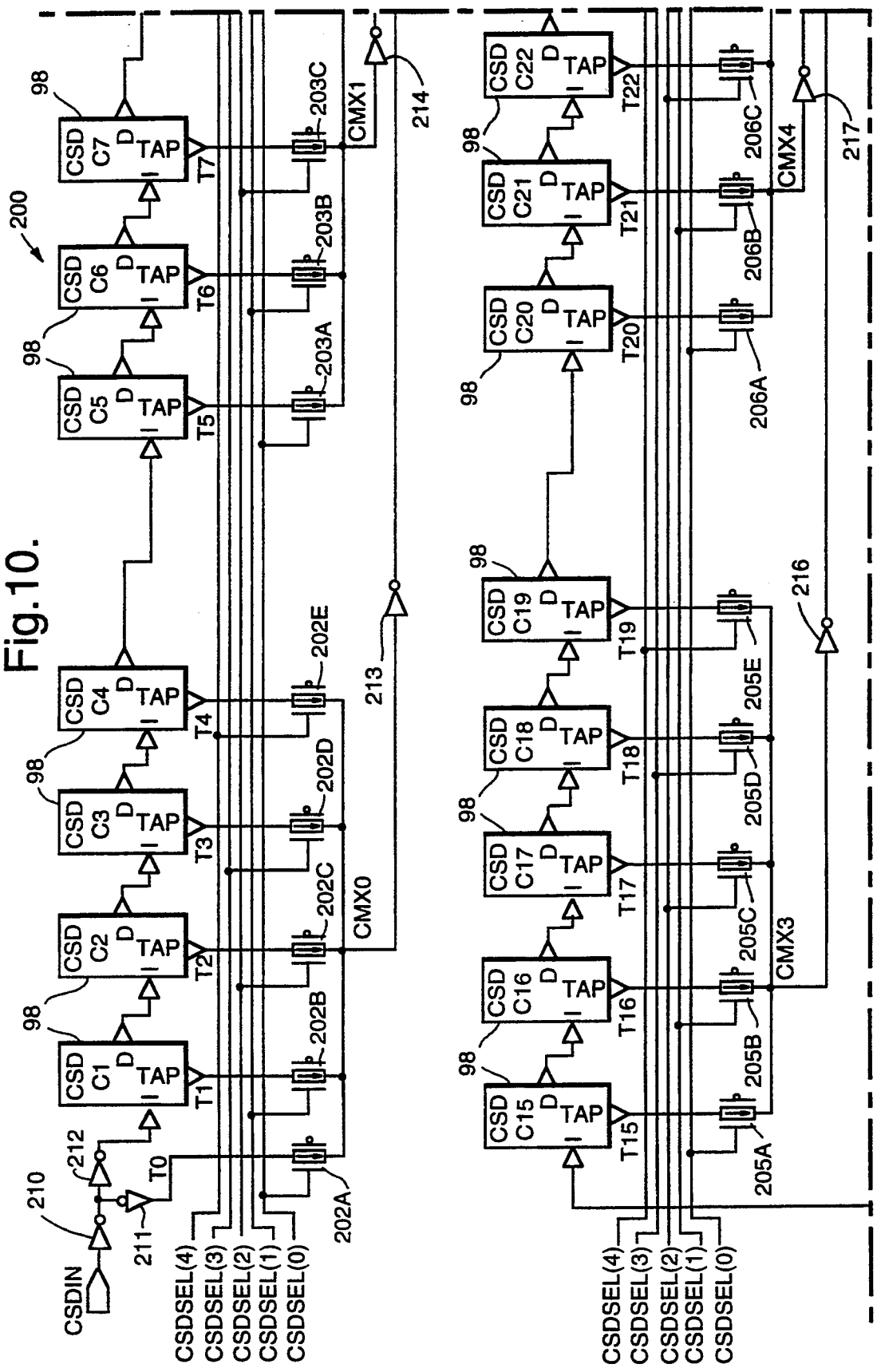
FIG. 10 is a schematic diagram of a coarse delay adjust circuit within the variable length delay circuit that allows coarse delay increments.

Referring to FIG. 10, a schematic diagram is shown of the coarse delay adjust circuit 200 (shown initially in FIG. 9). The circuit includes a plurality of coarse delay units (CSD units) 98, each including a tap terminal coupled to a separate transfer gate that is controlled by one of five signals (CSDSEL (4:0)) on the CSDSEL bus. It is noted that the 10-bit delay select vector CSDSEL(9:0) is used to select one of twenty-five tap points in a chain of CSD delay units 98. As mentioned earlier, a CSD unit 98 is a pair of inverters designed to have a relatively long propagation delay (see FIG. 5). In this embodiment, the selection is performed in two stages. One of five second-level multiplexer outputs is chosen with signals CSDSEL(5:9) through the control of transfer gates 208A–208E. A first-level multiplexer formed by transfer gates 202A–202E, 203A–203E, 204A–204E, 205A–205E, and 206A–206E selects one of five tap points using the CSDSEL(4:0) delay select signals. Thus, as a result of this configuration, the range of the delays selectable in the coarse delay adjust circuit 200 is from about one to about twenty-five CSD units. This range is not exactly one to twenty-five units since the delay of the first delay element formed by inverters 210–212 is not as long as the delay of a CSD element. This is provided to minimize the smallest coarse delay that is selectable. Inverters 219–222 and NAND gate 224 are provided to filter extraneous "glitches" or pulses, as will be explained in more detail below.

FIG. 11 is a schematic diagram illustrating the medium delay adjust circuit 225. It is noted that this circuit is implemented identically to the coarse delay adjust circuit 200, but with MSD units 99 incorporated in the place of the CSD units 98. An MSD unit 99 delay in this embodiment has about one-fifth the delay of a CSD unit 98. The ten-bit delay select vector MSDEL (9:0) is used to select one of twenty-five tap points in a chain of MSD delay units 99. As a result of this configuration, the range of delays selectable in the medium delay adjust circuit 225 is from one to twenty-five MSD units.

Figure 12:
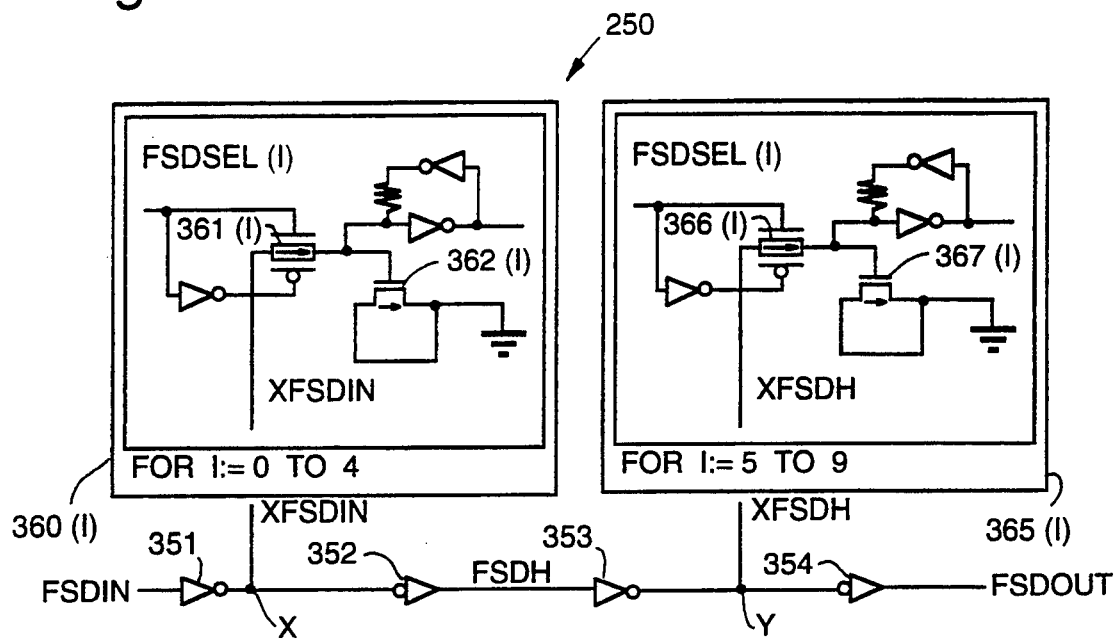
FIG. 12 is a schematic diagram of a fine delay adjust circuit within the variable length delay circuit that allows fine delay increments.

FIG. 12 is a schematic diagram that illustrates the fine delay adjust circuit 250. The fine delay adjust circuit 250 is constructed such that the VDEL delay can be controlled with a resolution of less than an inverter delay. In this embodiment the fine delay adjust circuit 250 includes a short inverter chain consisting of inverters 351–354. Two of the nodes (X and Y) in the chain are connected to a set of switching circuits 360(I) (where I=0, 1, . . . 4) and 365(I) (where I=5, 6, . . . 9). Each switching circuit 360(I) includes a transfer gate 361(I) that is controlled by signal FSDSEL(I). When the respective transfer gate 361(I) is turned on, a capacitance formed by a transistor 362(I) is connected between node X and ground. Similarly, each switching circuit 365(I) includes a transfer gate 366(I) that is controlled by signal FSDSEL(I) (where I=5, 6, . . . 9). When the respective transfer gate 366(I) is turned on, a capacitance formed by a transistor 367(I) is connected between node Y and ground. By switching in more capacitance, the delay through the fine delay adjust circuit 250 can be increased and vice-versa. In this embodiment the fine delay steps are about one-fifth of an MSD unit delay.

Referring back to the diagram of a VDEL unit shown in FIG. 9, it can now be seen that the delay through a VDEL unit can be controlled with a resolution of one FSTEP delay unit over a rather large range by selecting various combinations of coarse, medium and fine delays. The broad range of delays that can be selected is necessary to support a range of clock frequencies and to do so over the semiconductor process window and operating conditions window.

Referring back to FIG. 3, the coarse delay in each VDEL unit 40A–40D is specified every cycle of signal INCLK by the CSDSEL(9:0) bus from the control unit 70. Likewise, the MSDSEL(9:0) bus specifies the medium delay. The FSTEP units and their associated control buses, FSDUPD(3:0) and FSDSEL(9:0), specify the fine delay, and can actually provide two levels of control of the VDEL chain delay. These are designated fine and extra-fine. The timing of the delay control buses will be described next.

The delay tap vector DTAP(17:0) is sampled by the sampling latch 60 with the rising edge of signal IN-PULSE every INPULSE cycle. The control unit 70 monitors this vector and together with a set of stored state information, makes a decision about whether to adjust the delay chain length and if so, by how much and in which direction. Each of the four delay-control buses controlled by the control unit 70 potentially change state following a subsequent falling edge of signal INPULSE. It is noted that control unit 70 is a state machine that operates in accordance with the following description. An actual circuit-level implementation of the control unit 70 will be disclosed later.

The states of the delay control buses (also referred to as delay selects) may change very soon after the falling edge of signal INPULSE. At this time, the falling edge of signal INPULSE is propagating through the first VDEL unit 40A. To prevent the generation of extraneous pulses in the delay chain, the delay selects received by the delay components inside the VDEL units 40A–40D must not be allowed to change while the rising or falling edge of a pulse is traveling through that part of the delay chain. Latches are provided in each VDEL unit 40A–40D to ensure that this is the case. The latches function as follows. Referring to FIGS. 3 and 9, the coarse delay select lines from control unit 70 are received by the first VDEL unit 40A and are coupled to a set of latches 160(I), where I=0, 1, 2, . . . 9. The latches 160(I) (with outputs CSELO(9:0)) are opened a short time after the CSDOUT signal (provided from the coarse delay adjust circuit 200) goes low. As long as the CSDSEL bus from control unit 70 becomes stable a short time after the falling edge of signal INPULSE, the delay selects received by the coarse delay adjust unit 200 of the first VDEL unit 40A will be stable before the next rising edge of signal INPULSE begins propagating through that COARSED unit 200. The output of the latches 160(I) in the first VDEL unit 40A becomes the input to the equivalent latches in the second VDEL unit 40B. Thus, the coarse delay select signals received by a COARSED unit 200 only change after a falling edge has passed through that unit and before the next rising edge passes through. The same type of latching is performed on the medium step delay control bus, using latches 161(I). The fine step delay control is somewhat modified, as explained below.

Referring to FIG. 10, it is evident that the rising edge of the output signal of the COARSED delay chain is delayed by inverters 218–222 and NAND gate 224 before it leaves the COARSED unit 200. This is to filter out an extraneous pulse that can be generated by switching the delay select lines seen by COARSED unit 200 immediately after a falling edge comes out of that unit. This extraneous pulse arises because while the falling edge may have left the COARSED unit 200, it may not yet have reached the delay stage in the COARSED unit 200 that had been selected as the end of the COARSED delay chain. If the delay select lines are causing the delay chain to be increased by one CSD unit, then a small pulse may be generated as the chain is increased in length while the falling edge is still passing through the CSD unit 98 that is being added to the chain. As shown in FIG. 9, the CSD unit 170 in each VDEL unit (that has CSDOUT as its input) addresses the same problem in a slightly different way; the delay select line of latch 160(I) is not allowed to open until a CSD propagation delay after signal CSDOUT goes low.

The same techniques are used to prevent extraneous pulses from being generated by the medium delay adjust unit 225 of each VDEL unit 40A–40D; the delay select line of latch 161(I) is not allowed to open until a MSD propagation delay after EDELOUT goes low. This delay is provided by the MSD unit 171. Only a small delay formed by inverter 172 is needed between the output of the fine delay adjust unit 250 and its associated delay control bus latch 162(I).

The latching of the fine step delay control bus is modified to provide a finer level of resolution to the overall VDEL delay chain length. To understand the method for achieving this "extra-fine" delay step resolution, it is important to realize that when a unit of delay is added to or subtracted from each VDEL unit 40A–40D (whether "coarse" "medium" or "fine") the overall VDEL chain length changes by N times that unit of delay, where N is the number of VDEL units (4 in this embodiment).

The extra-fine delay step resolution is achieved by allowing the fine step delay chain in only one VDEL unit to change at a time. In the embodiment shown, this function is performed in the following manner. The FSDUPD(3:0) bus specifies which VDEL units 40A–40D will use the present cycle's FSDSEL delay control bus to specify the FSTEP unit's delay. If a VDEL unit 40A–40D is not to use the present cycle's FSDSEL vector, then the previous cycle's fine step delay vector is used instead. The previous cycle's fine step delay vector is held in the same latch that provides for the proper timing of the control vector to each of the VDEL units. For this reason, if a certain VDEL unit 40A–40D does not update its fine-step delay select latch, the VDEL units after that one do not either (since the fine-step delay select vector is latched in a serial fashion in each of the VDEL units). The algorithm used to control the latching of the fine step delay select vector will be discussed in more detail below.

The algorithm used to keep the delay chain adjusted such that the delay chain length remains equal to the period of signal INCLK is next considered. The initialization of the delay chain is discussed in a later section. It should be noted that a variety of alternative algorithms suitable for controlling the delay chain are possible, and that a variety of variations to the present algorithm are also possible. The employment of such alternative algorithms or variations do not depart from the spirit and scope of the invention.

The latched delay tap vector, LTAP(17:0) as illustrated in FIG. 3 is a snapshot of the delay chain state a short time after the rising edge of signal INPULSE. To detect where the previous pulse's rising edge is in the delay chain, bits 1 through 16 are each ANDed with the complement of the next higher bit (bit 1 AND not(bit 2), for example). The output vector of this ANDing operation is referred to as EDGELOC(16:1). The adjust algorithm operates such that there is never more than one rising edge in the delay chain (not counting the first two VDEL units, which may have the "current" rising edge in them—this is why LTAP(0) is not examined). Therefore, all bits of the EDGELOC vector should be zero except for at most one bit being one. If a bit of the vector is one, then the rising edge was between the corresponding delay tap and the next delay tap at the time the delay tap-vector was latched. For example, if EDGELOC(4) is true, it is because LTAP(4) is true and LTAP(5) is false. This implies that the rising edge had passed DTAP(4) but not yet reached DTAP(5) when the DTAP vector was latched.

The EDGELOC vector then indicates the location of the rising edge of the pulse in the delay chain every cycle by a bit of the vector being set. The EDGELOC vector is divided into regions as indicated in Table II below.

TABLE II

| region name | EDGELOC bit(s) | description |
| --- | --- | --- |
| LOFLWIN | 3:1 | left of lock window |
| INLWIN | 16:4 | in lock window |
| INLWINL | 5:4 | in left end of lock window |
| INLWINCL | 7:6 | in left of center of l.w. |
| INLWINLODC | 9:8 | left of dead center of l.w. |
| INLWINDC | 10 | in dead center of l.w. |
| INLWINRODC | 12:11 | right of dead center of l.w. |
| INLWINCR | 14:13 | in right end of center of l.w. |
| INLWINR | 16:15 | in right end of lock window |
| ROFLWIN | (none) | in right of the lock window |

In this description "left" indicates before and "right" indicates after. The schematics are shown such that the pulses travel from left to right through the various parts of the delay chain. The exact number of regions and how they are defined is not critical. The purpose is to categorize and name regions of the delay chain to make the algorithm clear.

In the present embodiment, the control unit 70 considers the present state of the EDGELOC vector and sometimes the previous cycle's state of this vector for the purpose of making an adjustment to the delay chain length. It may in some applications be desirable to store the states of additional previous cycles to take into account a longer history of previous edge locations and a history of previous adjustments taken.

When the rising edge is immediately to the left or right of the dead center of the lock window (regions INLWINRODC and INLWINLODC), delay length changes are only made in extra-fine steps. The algorithm can be changed easily such that the edge must be located in one of these regions for more than one cycle before any action is taken to change the delay length, but this should be balanced with the need to keep up with some maximum anticipated rate of change of the delay chain length due to environmental parameters. In the steady state, the rising edge should never leave one of the 3 regions INLWINLODC, INLWDC or INLWINRODC immediately surrounding (and including) the dead center of the lock window.

For robustness, allowance is made for the possibility that the edge could leave the immediate center of the lock window. As the edge is found farther away from the center, larger steps in the delay adjustment are taken to bring the edge back near the center. The adjustment type taken for each region is listed in Table III below.

TABLE III

| Region Name | EDGELOC bit(s) | Type of Adjustment Made |
| --- | --- | --- |
| LOFLWIN | 3:1 | medium step (see note 1) |
| INLWINL | 5:4 | fine step (note 2) |
| INLWINCL | 7:6 | fine step (note 2) |
| INLWINLODC | 9:8 | extra-fine step (note 2) |

TABLE III-continued

| Region Name | EDGELOC bit(s) | Type of Adjustment Made |
| --- | --- | --- |
| INLWINDC | 10 | no action taken |
| INLWINRODC | 12:11 | extra-fine step (note 2) |
| INLWINCR | 14:13 | fine step (note 2) |
| INLWINR | 16:15 | fine step (note 2) |
| ROFLWIN | (none) | medium step (see note 1) |

Note 1
the edge must be in these regions for two consecutive cycles before any action is taken.

Note 2
fine and extra-fine adjustments are only made once every second cycle. This is because of the delay between making an adjustment and seeing the effects of that adjustment. The delay adjustment is stabilized somewhat by this, though the response to rapid changes in environmental conditions is limited slightly.

The number of cycles between fine and extra-fine adjustments and the number of cycles that the edge is in a particular region before taking action are algorithm parameters that can be made variable. These parameters can be mask programmable, software programmable or can be modified automatically by the delay adjust algorithm. In this particular embodiment, these parameters are fixed.

It can be seen from FIGS. 10, 11 and 12 that the coarse, medium and fine delay ranges are limited. Even though environmental parameters such as temperature vary slowly, they can vary over a large range. In the steady state, it is quite likely that a certain type of delay (fine, for example) will be adjusted until no further adjustment is possible. When this happens, "wrapping" occurs. Wrapping is the increment or decrement by one of the next coarser delay units and a simultaneous compensating decrement or increment (respectively) of the delay unit that has reached the extent of its range. In this embodiment, the coarse delay units (CSD) 98 are designed to have a propagation delay five times that of a medium delay unit (MSD) 99. Similarly, an MSD propagation delay is designed to be five fine step delay units. Therefore, the delay that has reached the extent of its range is incremented or decremented by five to compensate for the decrement or increment (respectively) of the next coarser delay.

In the present embodiment, both the coarse and medium delay ranges are from one to twenty-five. The medium delay is wrapped down by five and the coarse delay is incremented by one if the medium delay is in the current state a twenty-four and more medium delay is needed. The medium delay is wrapped up by five and the coarse delay is decremented by one if the medium delay is at thirteen and less medium delay is needed.

The fine step delay has a range from zero to ten units. More or less medium step delay may be needed because the fine step delay has reached the end of its range. It is possible for medium delay to be at the limit of its range and the fine step delay to be at the limits of its range so that both medium and fine delays need to be wrapped. To limit the jitter caused by mismatches between the wrapping delay type and the next coarser delay type, this "double wrapping" is performed in stages. First the coarser wrapping operation takes place. The next finer wrapping takes place in a subsequent cycle if the need to do so still exists (the "jitter" induced by the first wrap may have been in the direction that eliminates the need for the next stage of wrapping. It should be noted that the jitter caused by mismatch between the coarse delay and the wrapping medium delay can be almost eliminated by constructing the coarse delay element out of five (in this case) medium delay elements.

The manner in which extra-fine adjustments are made is next considered. As mentioned previously, the FSDUPD(3:0) signals control which of the VDEL units 40A–40D update themselves with the new FSDUPD vector. The FSDUPD vector controls the delay of the FSTEP (fine step) unit 250. The allowed values that signal FSDUPD can have and the interpretation of these values are indicated in Table IV below.

TABLE IV

| FSDUPD(3:0) | VDEL units updating FSTEP delay control |
| --- | --- |
| 0001 | VD0 |
| 0011 | VD0, VD1 |
| 0111 | VD0, VD1, VD2 |
| 1111 | VD0, VD1, VD2, VD3 |

Note that if a VDEL unit 40A–40D is allowing its associated FSTEP unit 250 to be controlled by the fine step delay vector, then the VDEL units to the left of that one are also being controlled by the fine step delay vector. This occurs since the new fine step delay vector is passed from VDEL unit to VDEL unit. It is noted that this implementation requires fewer latches, but that it would be possible with additional latches to have a more flexible update scheme for the fine step delay vectors.

The extra-fine step adjustment is performed as follows. Assume that in a certain cycle, signal FSDUPD is 1111 and in the next cycle an extra-fine step adjustment is determined to be necessary. Signal FSDUPD is changed to 0001 and the fine step delay (specified by signal FSDSEL) is incremented or decremented by one fine step unit. VDEL units 40B, 40C and 40D will still respond to the old value of signal FSDSEL since they are not updated. VDEL unit 40A will on the other hand respond to the incremented or decremented FSDSEL signal and the VDEL chain as a whole will have its length changed by only one fine step unit. If, some number of cycles later, an additional change in the same direction is required (same direction meaning, for example, an extra-fine step increment followed by another extra-fine step increment), the FSDUPD signal is changed to 0011 while signal FSDSEL is kept unchanged. Now the first two units see the updated FSDSEL value and the overall delay has changed by another one fine step unit delay. This continues until signal FSDUPD is 1111 again and the sequence starts over again. No matter what state signal FSDUPD is in, if the delay adjustment changes direction, the signal FSDUPD is changed to 0001 and the signal FSDSEL is incremented or decremented. The delay adjustment is said to change direction if increment is required and the previous adjustment was a decrement or vice-versa.

Using this algorithm, the cumulative chain length can be constrained to change by not more than one fine step unit delay. If there are several direction reversals that occur fairly close together, it is possible that for some cycles, an extra-fine step adjustment is needed but is not taken since an FSTEP unit 250 is updated with a new fine step delay vector that happens to be the same as the one it had previously latched. This is of no real consequence, however, as rapid response is not needed and is actually undesirable if the direction of extra-fine step adjustments is changing frequently.

Note that if signal FSDUPD is 1111 and the FSDSEL vector is increased or decreased by one that the overall delay length is changed by four fine step unit delays. This is in fact how a fine step (in contrast to an extra-fine step) adjustment is made. In addition, when the fine step delay is being wrapped, the FSDUPD value is 1111 so that the fine step delay change can compensate correctly for the medium step delay change.

The initialization of the delay chain is next considered. At the beginning of initialization, signal IN-PULSE is controlled to have a duty cycle and period that corresponds to those of signal INCLK. This is to provide for reliable initialization of the delay chain. Signal INPULSE is strictly a function of signal INCLK during reset of the circuit. After the circuit leaves the reset state, signal INPULSE becomes a function of both signal INCLK and DTAP(1). The high time of signal INPULSE in this case is two VDEL propagation delays (and the duty cycle of signal INPULSE becomes 50% when the VDEL chain is matched to the period of signal INCLK). The coarse and medium delay select vectors are set to their minimum values at the beginning of initialization. This is to ensure that not more than one rising edge can be present in the delay chain.

Figure 13:
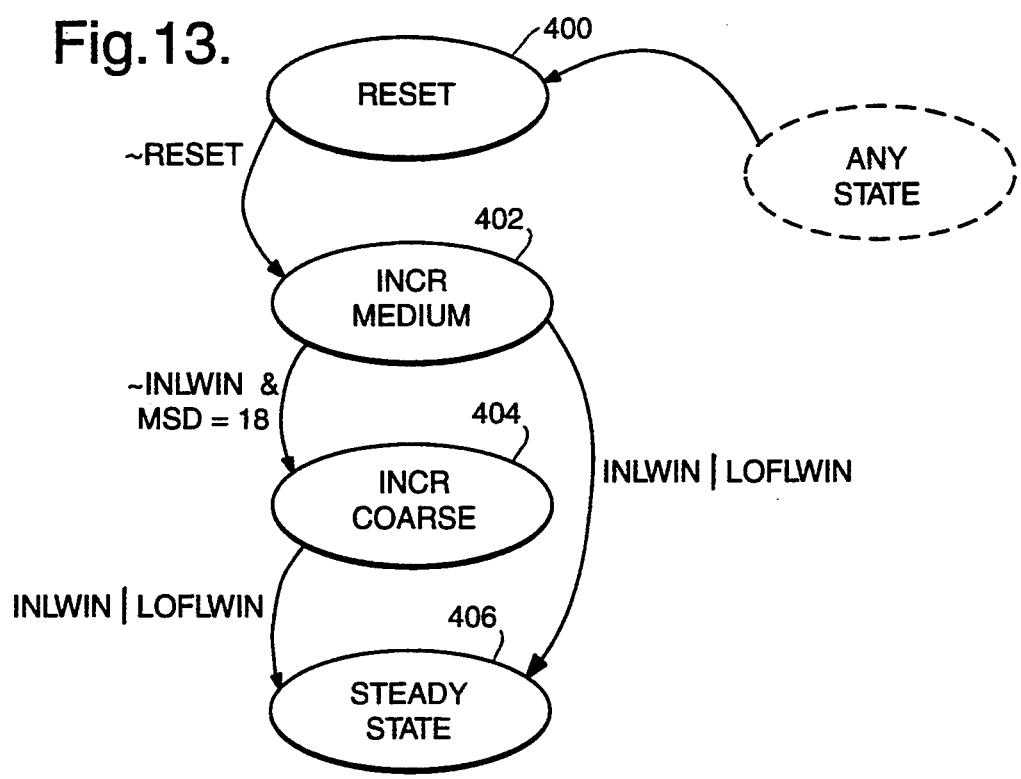
FIG. 13 is a flow chart illustrating the steps of initialization sequence for the speed detector unit.

The initialization sequence as shown in FIG. 13 begins when the circuit comes out of a reset state 400. The fine step delay vector is initially set to its nominal value of five (out of a range of one to ten).

First the medium step delay is increased during a state 402 until the rising edge is detected in the lock window or to the right of the lock window, or until the medium delay reaches a select value of eighteen, whichever event occurs first. If the medium delay select value reaches eighteen before the edge is detected inside or to the right of the lock window, then the coarse delay begins to be incremented during a state 404. This continues until the rising edge is in the lock window, is to the right of it, or until the coarse delay reaches the upper end of its range. At this point, the edge is either in the lock window or very close to it and the steady-state algorithm as described previously is implemented to make further adjustments during state 406.

The control unit 70 may be implemented in a variety of configurations. For example, an exemplary circuit implementation of control unit 70 is disclosed in the co-pending application entitled "Digital Clock Waveform Generator and Method for Generating a Clock Signal", Serial No. 08/011,068, by Stephen C. Horne and Scott H. R. McMahon, filed on Jan. 29, 1993. This application is incorporated herein by reference in its entirety.

From the foregoing description of the speed detector unit as shown in FIG. 3, it is evident that the delay select vectors CSDSEL (9:0), MSDSEL (9:0) and FSDSEL (9:0) are indicative of the relative speed of the integrated circuit. Therefore, a set of these signals are used as a circuit speed vector to control the drive strength of a variable drive buffer unit. For example, in one embodiment of the invention, the coarse delay select vector CSDSEL (9:0) is used as a circuit speed vector to control a variable buffer unit similar to that of FIG. 2 having ten tri-state buffer units coupled in parallel. It is noted that the delay select vectors may be encoded to form a variety of variations of the circuit speed vector to thus provide proper control of the variable drive buffer unit as well as to provide a proper range and resolution of drive strength. The encoding of the delay select signals into the circuit speed vector can be made software programmable, mask programmable, or package-bonding programmable depending upon the requirements of the specific application.

Figure 14:
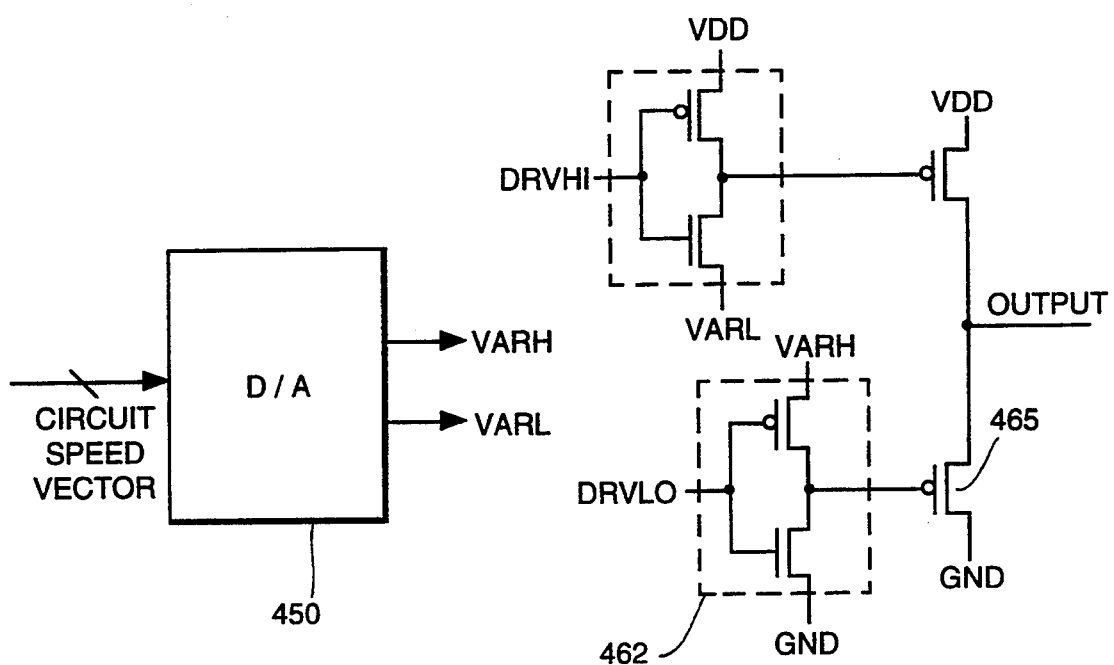
FIG. 14 is a schematic diagram of a second embodiment of a self-adjusting variable drive strength buffer circuit.

An alternative method for controlling the drive strength is to generate one or more analog voltages from the circuit speed vector and use these voltages to vary the drive of the buffer. FIG. 14 shows an implementation of a buffer unit having a drive strength that is varied in such a way. The advantage to this method is that it provides a finer-grained control of the buffer drive strength.

A digital to analog converter 450 receives the circuit speed vector as an input and produces two analog voltages as outputs, VARH and VARL. VARH is used in place of VDD at the source of a p-channel transistor 460 in an inverter 462 that drives a pull-down transistor 465 of the output stage of the buffer unit. As the delay chain length is increased to compensate for the faster operating conditions, VARH is decreased. Thus the pull-down transistor 465 of the output stage is driven by a lower gate voltage than is normal and thus has less drive strength. Likewise, as operating conditions cause the circuit to become "slow" (such conditions are high frequency, high temperature, and low operating voltage), the delay chain is shortened. The circuit speed vector in this case will cause the D/A converter 450 to produce a higher VARH voltage. With this higher gate voltage, the pull-down transistor 465 in the buffer output stage has greater drive strength, as appropriate for the relatively slow circuit. In the limit, VARH becomes closer to VDD for very slow circuit conditions and is somewhere between VDD and GND for fast circuit conditions. The precise voltages produced are a function of the design goals for the device. The VARL voltage is controlled in a similar manner; it approaches GND for slow circuit conditions (maximum drive strength in the pull-up transistor of the buffer final stage) and somewhere between VDD and GND for fast circuit conditions.

Numerous modifications and variations will become apparent to those skilled in the art once the above disclosure is fully appreciated. For example, although the embodiment described above includes a delay chain consisting of four variable length delay units 40A-40D, the delay chain could instead consist of a single variable length delay unit or any other number of variable length delay units. In addition, other speed detector units that measure the relative speed of an integrated circuit may be employed, and moreover, other control units that monitor a propagation delay through the delay chain and that match the propagation delay of the delay chain to the period of the input timing signal (i.e., signal IN-PULSE) may be employed.

It is to be understood that the above detailed description of the preferred embodiments is intended to be merely illustrative of the spirit and scope of the invention and should not be taken in a limiting sense. The scope of the claimed invention is better defined with reference to the following claims.

What is claimed is:

1. A self-adjusting buffer circuit comprising:
   a delay chain including an input node and an output node wherein a propagation delay between the input node and the output node is variable and is dependent upon a delay select signal;
   a control unit for generating the delay select signal and coupled to said delay chain, wherein the delay select signal controls the propagation delay of said delay chain such that a period of a timing signal provided to the input node of said delay chain substantially equals the propagation delay of said delay chain;

a buffer unit including an input terminal, an output terminal, and a control terminal, wherein a control signal indicative of the delay select signal is provided to said control terminal and wherein a drive strength of said buffer unit varies in response to the control signal; and a lock window unit coupled to the output node of said delay chain, wherein said lock window unit includes a plurality of delay elements coupled in series, and wherein said control unit is coupled to receive a plurality of signal levels at a plurality of nodes that connect said plurality of delay elements.

2. The self-adjusting buffer circuit as recited in claim 1 wherein a first signal transition of said timing signal propagates through said plurality of delay elements of said lock window after said first signal transition propagates through said delay chain.

3. The self-adjusting buffer circuit as recited in claim 1 wherein the plurality of signal levels are indicative of a position of the first signal transition of said timing signal with respect to said plurality of delay elements.

4. The self-adjusting buffer circuit as recited in claim 3 further comprising a latch circuit coupled to said lock window unit and to said control unit for latching the plurality of signal levels and for providing a plurality of latched signal levels to said control unit.

5. The self-adjusting buffer circuit as recited in claim 4 wherein said latch circuit latches said plurality of signal levels in response to a second signal transition of said timing signal that occurs subsequent to the first signal transition.

6. The self-adjusting buffer circuit as recited in claim 5 wherein said latch circuit latches said plurality of signal levels a predetermined time after the second signal transition of said timing signal occurs at the input node of said delay chain.

* * * * *